(12) United States Patent
Im et al.

(10) Patent No.: US 12,708,037 B2
(45) Date of Patent: Aug. 11, 2026

(54) DISPLAY DEVICE HAVING REFLECTIVE STRUCTURE REFLECTING LIGHT FROM LIGHT EMITTING DIODE

(71) Applicant: Samsung Display Co., LTD., Yongin-si (KR)

(72) Inventors: Hyun Deok Im, Seoul (KR); Jong Hyuk Kang, Suwon-si (KR); Yang Gyu Jang, Cheonan-si (KR); Eun A Cho, Gunpo-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 454 days.

(21) Appl. No.: 17/724,683

(22) Filed: Apr. 20, 2022

(65) Prior Publication Data

US 2022/0367424 A1 Nov. 17, 2022

(30) Foreign Application Priority Data

May 14, 2021 (KR) ........................ 10-2021-0062370

(51) Int. Cl.

| | |
|---|---|
| ***H01L 25/075*** | (2006.01) |
| ***H10H 20/814*** | (2025.01) |
| ***H10H 20/825*** | (2025.01) |
| ***H10H 20/831*** | (2025.01) |
| ***H10H 20/832*** | (2025.01) |

(Continued)

(52) U.S. Cl.

CPC .......... *H10W 90/00* (2026.01); *H10H 20/814* (2025.01); *H10H 20/825* (2025.01); *H10H 20/8312* (2025.01); *H10H 20/835* (2025.01); *H10H 20/857* (2025.01)

(58) Field of Classification Search

None

See application file for complete search history.

(56) References Cited

U.S. PATENT DOCUMENTS 9,231,231 B2 1/2016 Kim et al.
9,530,989 B2 12/2016 Kim et al.
(Continued)

FOREIGN PATENT DOCUMENTS

CN 110690240 A 1/2020
CN 112514085 A 3/2021
(Continued)

OTHER PUBLICATIONS

Z. K. Wang et al., "Polymer hydrophilicity and hydrophobicity induced by femtosecond laser direct irradiation", Applied Physics Letters, Sep. 17, 2009, pp. 1-3, vol. 95, No. 111110.

*Primary Examiner* — Sue A Purvis
*Assistant Examiner* — Seyon Ali-Simah Punchbeddell
(74) *Attorney, Agent, or Firm* — Womble Bond Dickinson (US) LLP

(57) ABSTRACT

A display device comprises first banks disposed on a substrate and spaced apart from each other in a first direction; a first electrode and a second electrode disposed on the first banks; a light emitting diode disposed between the first electrode and the second electrode; and at least one reflective structure disposed between the first electrode and the second electrode and spaced apart from the light emitting diode. The light emitting diode and the at least one reflective structure are spaced apart from each other in a second direction intersecting the first direction.

23 Claims, 18 Drawing Sheets

(51) Int. Cl.
*H10H 20/857* (2025.01)
*H10W 90/00* (2026.01)

(56) References Cited

U.S. PATENT DOCUMENTS

| | | | | |
|---|---|---|---|---|
| 10,026,777 | B2 | 7/2018 | Kang et al. | |
| 10,269,865 | B2 | 4/2019 | Kang et al. | |
| 10,665,633 | B2 | 5/2020 | Kang et al. | |
| 11,088,197 | B2 | 8/2021 | Kang et al. | |
| 11,411,143 | B2 | 8/2022 | Lee | |
| 11,610,934 | B2 | 3/2023 | Kang et al. | |
| 11,824,138 | B2 | 11/2023 | Beak et al. | |
| 12,027,508 | B2 | 7/2024 | Yoo et al. | |
| 12,183,857 | B2 | 12/2024 | Kim et al. | |
| 12,283,604 | B2 | 4/2025 | Kang et al. | |
| 2009/0085471 | A1 | 4/2009 | Tsujimura | |
| 2015/0041777 | A1 | 2/2015 | Chung et al. | |
| 2016/0181332 | A1 | 6/2016 | Park et al. | |
| 2018/0211979 | A1 | 7/2018 | Lee et al. | |
| 2019/0252576 | A1 | 8/2019 | Lee et al. | |
| 2020/0013929 | A1* | 1/2020 | Lee | H10D 30/0295 |
| 2020/0152841 | A1* | 5/2020 | Han | H01L 33/32 |
| 2021/0066406 | A1 | 3/2021 | Kim et al. | |
| 2021/0351171 | A1* | 11/2021 | Yoo | H01L 33/44 |
| 2022/0352426 | A1 | 11/2022 | Lee | |
| 2024/0055556 | A1 | 2/2024 | Beak et al. | |

FOREIGN PATENT DOCUMENTS

| | | | | |
|---|---|---|---|---|
| CN | 112740406 A | 4/2021 | | |
| KR | 20140014683 A | 2/2014 | | |
| KR | 10-2015-0006798 | 1/2015 | | |
| KR | 10-1490758 | 2/2015 | | |
| KR | 20180071465 A | 6/2018 | | |
| KR | 10-2020-0034904 | 4/2020 | | |
| KR | 20200049394 A | 5/2020 | | |
| KR | 10-2020-0088951 | 7/2020 | | |
| WO | WO-2020059989 A1 * | 3/2020 | | H01L 24/95 |

* cited by examiner

PX
SPX1
SPX2
SPX3
BNK2
BNK2
CNT1
CNT2
A
AE
AE1
AE2
ED
RS
CTE1
CTE2
CTE
CE1
CE2
CE
II
II'
III
III'
DR1
DR2
DR3

DISPLAY DEVICE HAVING REFLECTIVE STRUCTURE REFLECTING LIGHT FROM LIGHT EMITTING DIODE

CROSS-REFERENCE TO RELATED APPLICATION(S)

This application is based on and claims priority to and benefits of Korean Patent Application No. 10-2021-0062370 under 35 U.S.C. 119, filed on May 14, 2021 in the Korean Intellectual Property Office (KIPO), the disclosure of which is incorporated by reference herein in its entirety.

BACKGROUND

1. Technical Field

The disclosure relates to a display device, and more specifically, to a display device having improved reflective luminance in an upper direction of the display device.

2. Description of the Related Art

The importance of display devices for image display has increased in various forms with the development of information processing technology. For example, the display devices have been applied to various electronic devices, such as a smart phone, a digital camera, a notebook computer, a navigator and a smart television. The display devices may be a flat panel display device such as a liquid crystal display device, a field emission display device and an organic light emitting display device. Among the flat panel display devices, a light emitting display device includes light emitting diodes, which emit light independently without a light emitting unit. The light emitting display devices, in contrast to the liquid crystal display devices, have grown in popularity given their ability to emit light independently of a separate light source, and as a result, their reduced thickness and weight.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An object of the disclosure is to provide a display device having improved reflective luminance in a long axis direction (or longitudinal direction) of a light emitting diode.

The objects of the disclosure are not limited to those mentioned above, and additional objects of the disclosure, which are not mentioned herein, will be clearly understood by those skilled in the art from the following description of the disclosure.

A display device according to an embodiment to achieve the above objects may comprise first banks disposed on a substrate and spaced apart from each other in a first direction; a first electrode and a second electrode disposed on the first banks; a light emitting diode disposed between the first electrode and the second electrode; and at least one reflective structure disposed between the first electrode and the second electrode and spaced apart from the light emitting diode, The light emitting diode and the at least one reflective structure may be spaced apart from each other in a second direction intersecting the first direction.

An end portion of the light emitting diode may be electrically connected to the first electrode, and another end portion of the light emitting diode may be electrically connected to the second electrode.

The display device may further comprise a first insulating layer disposed on the first electrode and the second electrode. The first insulating layer may overlap a portion of the first electrode and a portion of the second electrode.

The display device may further comprise a first contact electrode and a second contact electrode disposed on the first insulating layer. The first contact electrode may electrically connect the light emitting diode to the first electrode, and the second contact may electrode electrically connect the light emitting diode to the second electrode.

The first contact electrode may electrically contact the end portion of the light emitting diode, and the second contact electrode may electrically contact the another end portion of the light emitting diode.

The light emitting diode may have a shape extended in the first direction and emits light.

Each of the first electrode and the second electrode may include a reflective conductive material.

The reflective conductive material may include Ag, Cu or Al.

Each of the first electrode and the second electrode may reflect the light emitted from the light emitting diode toward an upper direction of the display device.

An end portion of the at least one reflective structure may contact the first electrode, and another end portion of the at least one reflective structure may contact the second electrode.

The first contact electrode may electrically connect the at least one reflective structure with the first electrode, and the second contact electrode may contact the at least one reflective structure and electrically contact the second electrode.

The first contact electrode may contact an end portion of the at least one reflective structure, and the second contact electrode may contact the another end portion of the at least one reflective structure.

The at least one reflective structure may have a shape extended in the first direction.

The at least one reflective structure may include a plurality of reflective structures, the plurality of reflective structures may be spaced apart from each other, and the light emitting diode may be disposed between the reflective structures.

The at least one reflective structure may reflect the light emitted from the light emitting diode toward an upper direction of the display device.

A display device according to an embodiment to achieve the above objects may comprise first banks disposed on a substrate and spaced apart from each other in a direction; a first electrode and a second electrode disposed on the first banks; and at least one reflective structure disposed between the first electrode and the second electrode. The at least one reflective structure may have a shape extended in the direction, and may include a core layer, a reflective conductive pattern surrounding an outer surface of the core layer, and an insulating film surrounding an outer surface of the reflective conductive pattern.

The core layer may include an end portion positioned at one side in the direction; and another end portion positioned at another side in the direction opposite to the end portion. The reflective conductive pattern may overlap at least one of the end portion and the another end portion of the core layer.

The reflective conductive pattern may include Ag, Cu, or Al, and the core layer may include AlGaInN, GaN, AlGaN, InGaN, AlN, InN, or Si.

The core layer may include an end portion positioned at one side in the direction; and another end portion positioned at another side in the direction. The reflective conductive pattern may overlap the end portion and the another end portion of the core layer.

The core layer may include a glass material.

Details of the other embodiments are included in the detailed description and drawings.

In the display device according to the embodiments, reflective luminance may be improved in a longitudinal direction of a light emitting diode.

The effects according to the embodiments of the present disclosure are not limited to those mentioned above, and more various effects are included in the following description of the present disclosure.

BRIEF DESCRIPTION OF THE DRAWINGS

The above and other aspects and features of the disclosure will become more apparent by describing in detail embodiments thereof with reference to the attached drawings, in which:

FIG. 6 is a schematic enlarged cross-sectional view illustrating area B of FIG. 5;

FIG. 7 is a schematic view illustrating a light emitting diode according to an embodiment of the disclosure;

FIG. 10 is a schematic enlarged cross-sectional view illustrating area C of FIG. 5;

DETAILED DESCRIPTION OF THE EMBODIMENTS

Figure 1:
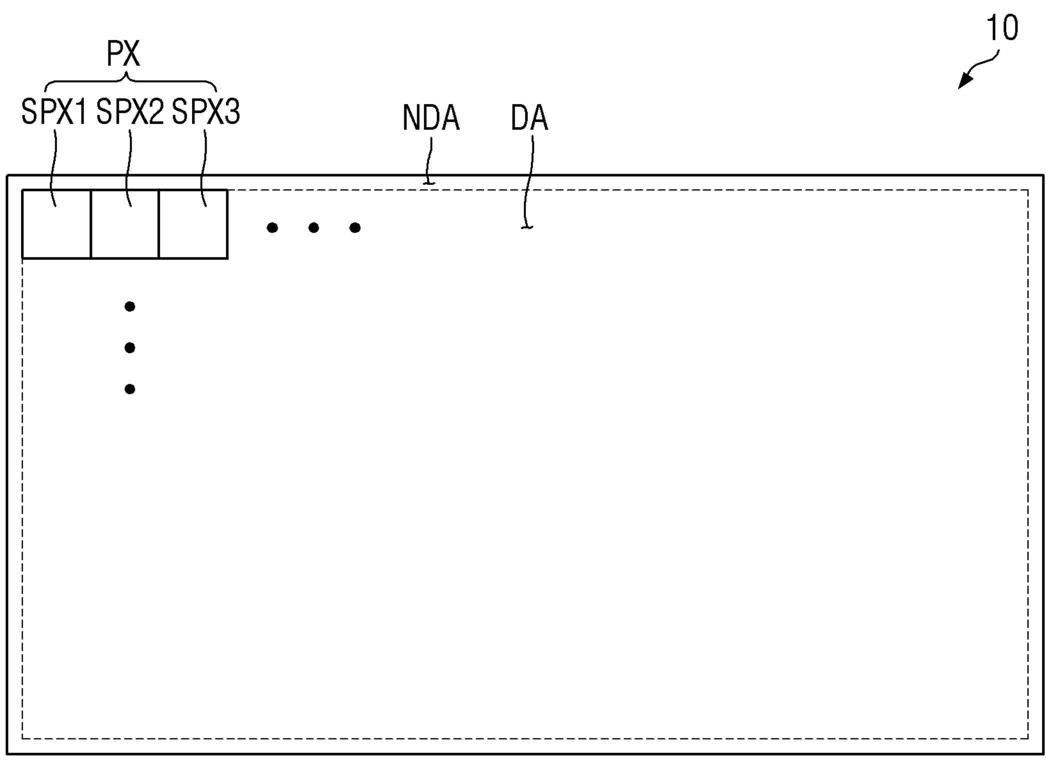
FIG. 1 is a schematic plan view illustrating a display device according to an embodiment of the disclosure.
Figure 1:
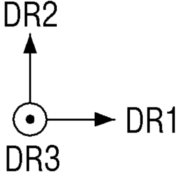

Embodiments of the invention will be described hereinafter with reference to the accompanying drawings. Although the embodiments may be modified in various manners and have additional embodiments, embodiments are illustrated in the accompanying drawings and will be mainly described in the specification. However, the scope of the disclosure is not limited to the embodiments in the accompanying drawings and the specification and should be construed as including all the changes, equivalents and substitutions included in the spirit and scope of the disclosure.

It will be understood that when an element is referred to as being related to another element such as being "coupled" or "connected" to another element, it can be directly coupled or connected to the other element or intervening elements may exist therebetween. In contrast, it should be understood that when an element is referred to as being related to another element such as being "directly coupled" or "directly connected" to another element, there are no intervening elements. Other expressions that explain the relationship between elements, such as "between," "directly between," "adjacent to," or "directly adjacent to," should be construed in the same way.

Throughout the specification, the same reference numerals will refer to the same or like parts.

In the drawings, sizes and thicknesses of elements may be enlarged for clarity and ease of description thereof. However, the embodiments are not limited to the illustrated sizes and thicknesses. In the drawings, the thicknesses of layers, films, panels, regions, and other elements may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a cross-sectional view" means when a cross-section taken by vertically cutting an object portion is viewed from the side.

When a layer, film, region, substrate, or area, is referred to as being "on" another layer, film, region, substrate, or area, it may be directly on the other film, region, substrate, or area, or intervening films, regions, substrates, or areas, may exist therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may exist therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

It will be understood that, although the terms "first," "second," "third" or the like may be used herein to describe various elements, components, regions, layers and/or sections, these elements, components, regions, layers and/or sections should not be limited by these terms. These terms are only used to distinguish one element, component, region, layer or section from another element, component, region, layer or section. For example, "a first element," "component," "region," "layer" or "section" discussed below could be termed a second or third element, component, region, layer or section without departing from the teachings herein. For example, a first color filter may be any one of a red, green, or blue color filter. A second color filter may be any one of a red, green, or blue color filter. A third color filter may be any one of a red, green, or blue color filter. First and second with respect to the light blocking members may be used interchangeably in the specification.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, the spatially relative terms, such as "below", "beneath", "lower", "above", "bottom", "upper", "top", or the like, may be used herein for ease of describe the relations between one element and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative terms "below" or "beneath" may include both the lower and upper positions. The device may also be oriented in other directions and thus the spatially relative terms may be interpreted differently depending on the orientations.

"About" or "approximately" as used herein is inclusive of the stated value and means within an acceptable range of deviation for the particular value as determined by those skilled in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined or implied herein, all terms herein (including technical and scientific terms) used herein have the same meaning as commonly understood by those skilled in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined in the specification.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as being limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the disclosure.

Hereinafter, embodiments will be described with reference to the attached drawings.

FIG. 1 is a schematic plan view illustrating a display device according to an embodiment of the disclosure.

Referring to FIG. 1, the display device 10 may have a rectangular shape that includes a long side and a short side. The long side of the display device 10 may be extended in a first direction DR1, and the short side of the display device 10 may be extended in a second direction DR2. The first direction DR1 and the second direction DR2 may cross each other. For example, the first direction DR1 and the second direction DR2 may be perpendicular to each other, but is not limited thereto. A third direction DR3 may be a thickness direction toward an upper direction of the display device 10, and may be perpendicular to a plane defined by the first and second directions DR1 and DR2.

The display device 10 may include a display area DA and a non-display area NDA. The display area DA may include pixels PX to display an image. The non-display area NDA may be adjacent to the display area DA, and surround the display area DA. The image may not be displayed in the non-display area NDA.

The display area DA may include the pixels PX. The pixels PX may be arranged in a matrix shape. A row direction of the matrix shape may be the first direction DR1, and a column direction of the matrix shape may be the second direction DR2. The pixels PX may include first to third subpixels SPX1, SPX2, and SPX3. The first to third subpixels SPX1, SPX2, and SPX3 may respectively correspond to first to third emission areas LA1, LA2, and LA3 (refer to FIG. 2) that is provided below with reference to the drawings. An emission diode ED (refer to FIG. 4) may be disposed on each of the first to third subpixels SPX1, SPX2, and SPX3. The emission diodes ED (refer to FIG. 4) may emit light through the first to third emission areas LA1, LA2, and LA3 (refer to FIG. 2).

The first to third subpixels SPX1, SPX2, and SPX3 may emit light of a same color. For example, the first to third subpixels SPX1, SPX2, and SPX3 may include emission diodes ED (refer to FIG. 4) of a same type, and may emit light of a third color or blue light. In another example, the first to third subpixels SPX1, SPX2, and SPX3 may emit light of different colors. For example, the first subpixel SPX1 may emit light of a first color or red light, the second subpixel SPX2 may emit light of a second color or green light, and the third subpixel SPX3 may emit light of a third color or blue light.

Figure 2:
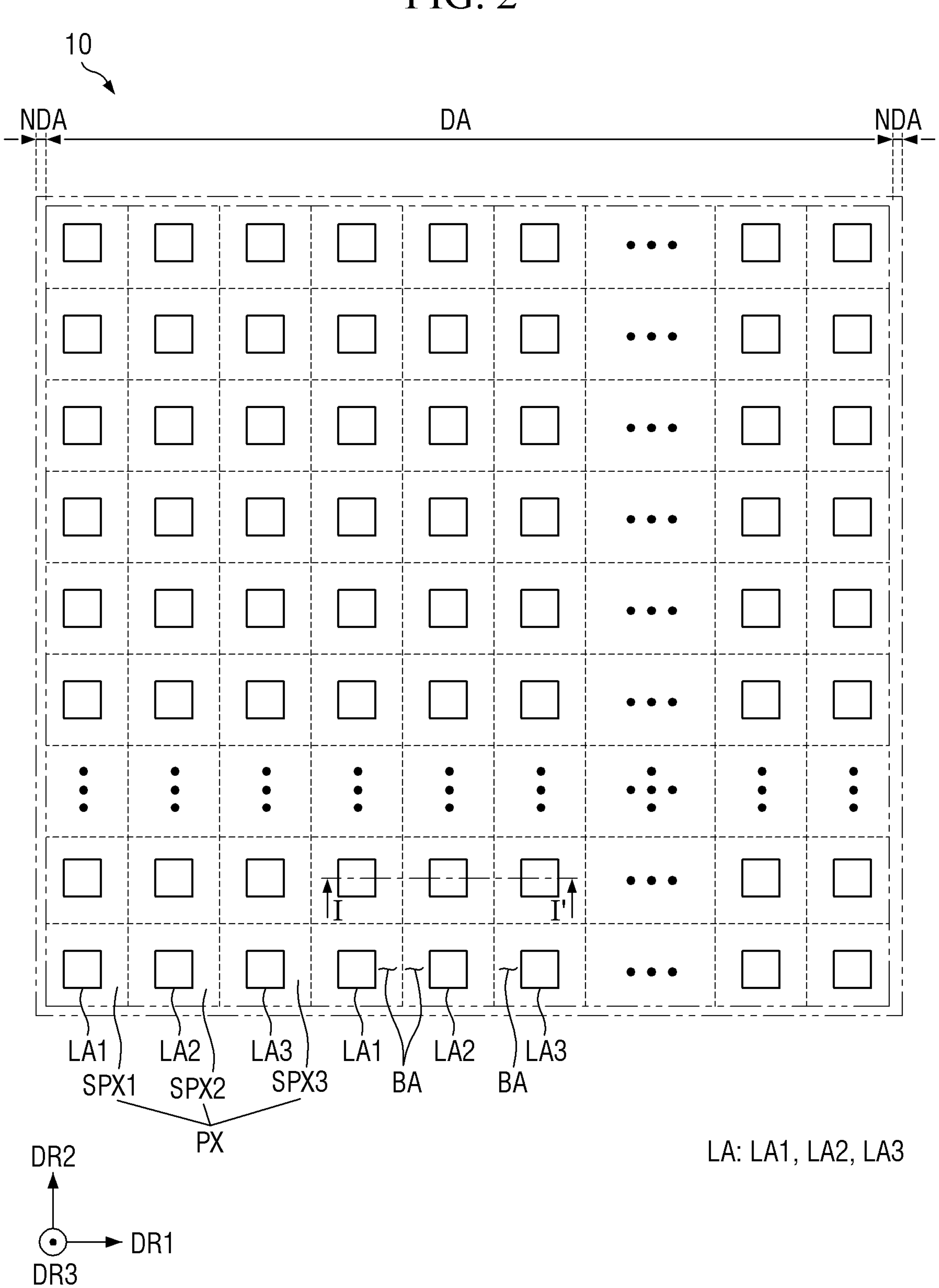
FIG. 2 is a e plan view illustrating subpixels of FIG. 1.

FIG. 2 is a schematic plan view illustrating subpixels of FIG. 1.

Referring to FIG. 2, the pixels PX may include emission areas LA defined by a pixel definition film. The pixels PX may emit light having a peak wavelength through the emission areas LA. For example, the display area DA of the display device 10 may include the first to third emission areas LA1, LA2, and LA3. The emission diodes ED (refer to FIG. 4) of the display device 10 may emit light through the first to third emission areas LA1, LA2, and LA3.

The first to third emission areas LA1, LA2, and LA3 may emit light having a peak wavelength to the outside of the display device 10. For example, the first to third emission areas LA1, LA2, and LA3 may emit the same color. In another example, the first emission area LA1 may emit the light of the first color, the second emission area LA2 may emit the light of the second color, and the third emission area LA3 may emit the light of the third color. For example, the light of the first color may be, but not limited to, the red light having a peak wavelength in a range of about 610 nm to about 650 nm, the light of the second color may be, but not limited to, the green light having a peak wavelength in a range of about 510 nm to about 550 nm, and the light of the third color may be, but not limited to, the blue light having a peak wavelength in a range of about 440 nm to about 480 nm. It should be noted that the lights of the first to third colors may not be limited to the above-mentioned wavelengths.

The first to third emission areas LA1, LA2, and LA3 may be repeatedly disposed along the first direction DR1 of the display area DA. For example, a width of the first emission area LA1 in the first direction DR1 may be greater than that of the second emission area LA2 in the first direction DR1. A width the second emission area LA2 in the first direction DR1 may be greater than that of the third emission area LA3 in the first direction DR1. In another example, the width of the first direction DR1 of the first emission area LA1, the width of the first direction DR1 of the second emission area LA2, and the width of the first direction DR1 of the third emission area LA3 may substantially be equal to one another.

For example, a size of the first emission area LA1 may be greater than that of the second emission area LA2, and a size of the second emission area LA2 may be greater than that of the third emission area LA3. In another example, the first to third emission areas LA1, LA2 and LA3 may have substantially the same size.

The display area DA may include a light blocking area BA. For example, the display area DA of the display device 10 may include multiple light-shielding areas (or light blocking area) BA surrounding multiple emission areas LA. The light blocking area BA may be disposed at a side of each of the first to third emission areas LA1, LA2, and LA3, and may prevent color mixture of lights emitted from the first to third emission areas LA1, LA2, and LA3. For example, the light blocking area may prevent color mixture of lights emitted from adjacent ones of the first to third emission areas LA1, LA2, and LA3.

Figure 3:
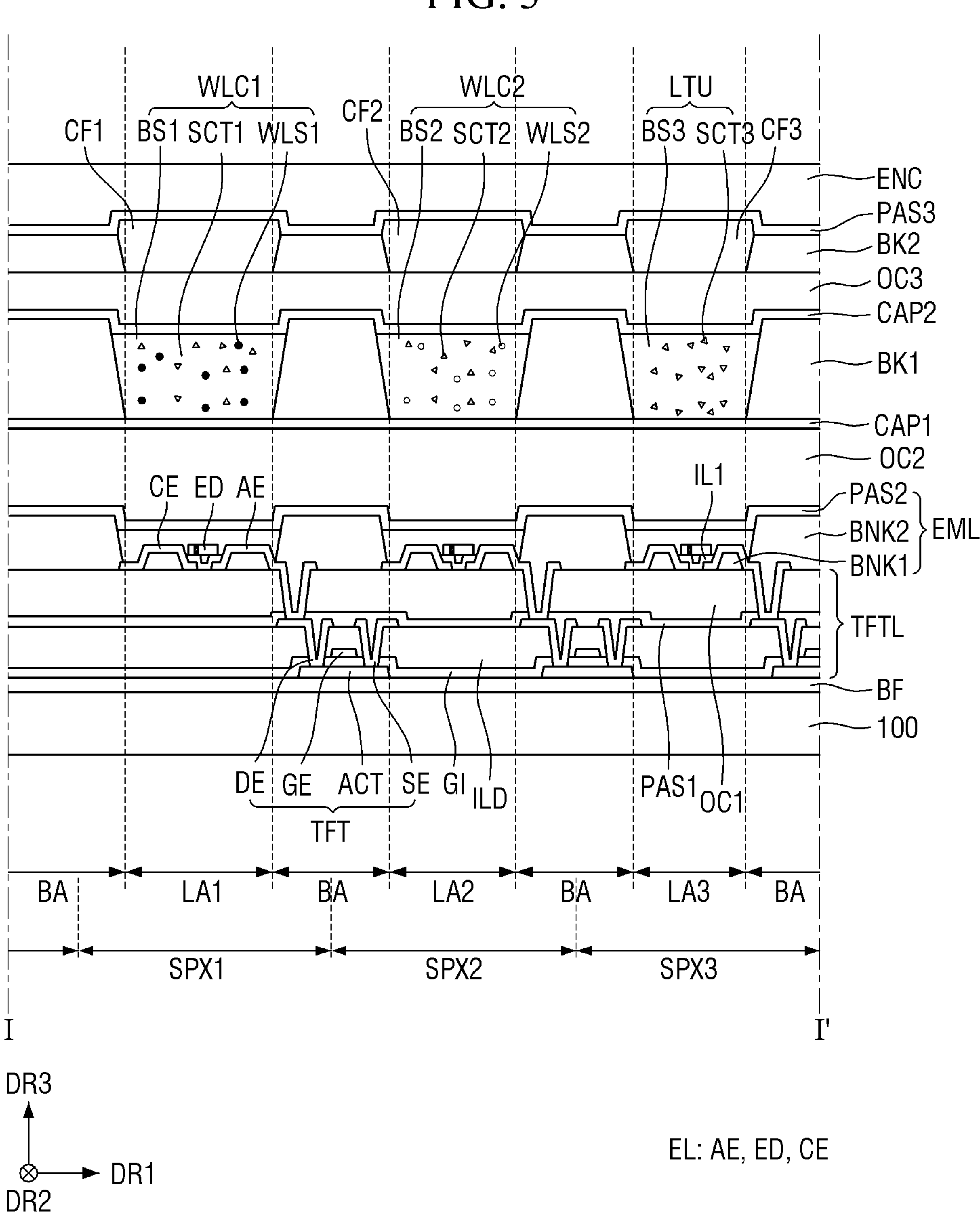
FIG. 3 is a schematic cross-sectional view taken along line I-I' of FIG. 2.

FIG. 3 is a schematic cross-sectional view taken along line I-I' of FIG. 2.

Referring to FIGS. 2 and 3, the display area DA of the display device 10 may include the first to third emission areas LA1, LA2, and LA3. The light generated from the emission diode ED of the display device 10 may be emitted toward the outside of the display device 10 through the first to third emission areas LA1, LA2, and LA3.

The display device 10 may include a substrate 100, a buffer layer BF, a thin film transistor layer TFTL, and a light emitting diode layer EML.

The substrate 100 may be a base substrate or a base member, and may be made of an insulating material such as a polymer resin. For example, the substrate 100 may be (or include) a rigid substrate. In case that the substrate 100 is the rigid substrate, the substrate 100 may include a glass material or a metallic material, but is not limited thereto. In another example, the substrate 100 may be a flexible substrate capable of bending, folding, rolling, etc. In case that the substrate 100 is the flexible substrate, the substrate 100 may include polyimide (PI), but is not limited thereto.

The buffer layer BF may be disposed on the substrate 100. The buffer layer BF may be made of an inorganic film. that may prevent the air or water from being permeated thereinto. For example, the buffer layer BF may include inorganic films that are alternately deposited.

The thin film transistor layer TFTL may include a thin film transistor TFT, a gate insulating film GI, an interlayer dielectric film ILD, a first passivation layer PAS1, and a first planarization layer OC1.

The thin film transistor TFT may be disposed on the buffer layer BF. The thin film transistor TFT may constitute a pixel circuit of each pixel PX (e.g., refer to FIG. 2). For example, the thin film transistor TFT may be a driving transistor or a switching transistor of the pixel circuit. The thin film transistor TFT may include a semiconductor layer ACT, a gate electrode GE, a source electrode SE, and a drain electrode DE.

The semiconductor layer ACT may be provided on the buffer layer BF. The semiconductor layer ACT may overlap the gate electrode GE, the source electrode SE, and the drain electrode DE. The semiconductor layer ACT may contact (e.g. directly contact) the source electrode SE and the drain electrode DE. The semiconductor layer ACT may face the gate electrode GE, and the gate insulating film GI may be interposed between the semiconductor layer ACT and the gate electrode GE.

The gate electrode GE may be disposed on the gate insulating film GI. The gate electrode GE may overlap the semiconductor layer ACT, and the gate insulating film GI may be interposed between the gate electrode GE and the semiconductor layer ACT.

The source electrode SE and the drain electrode DE may be spaced apart from each other on the interlayer dielectric film ILD. The source electrode SE may contact (e.g. directly contact) an end portion of the semiconductor layer ACT through a contact hole provided through the gate insulating film GI and the interlayer dielectric film ILD. For example, the source electrode SE may be electrically connected to the end portion of the semiconductor layer ACT through the contact hole. The drain electrode DE may contact (e.g. directly contact) another end portion of the semiconductor layer ACT through a contact hole provided in the gate insulating film GI and the interlayer dielectric film ILD. For example, the drain electrode DE may be electrically connected to the another end portion of the semiconductor layer ACT through the contact hole. The drain electrode DE may be electrically connected to a first electrode AE of a light emitting member EL through a contact hole provided through the first passivation layer PAS1 and the first planarization layer OC1.

The gate insulating film GI may be provided on the semiconductor layer ACT. For example, the gate insulating film GI may be disposed on the semiconductor layer ACT and the buffer layer BF. The gate insulating film GE may electrically insulate the semiconductor layer ACT from the gate electrode GE. The gate insulating film GI may include a contact hole through which the source electrode SE passes, and a contact hole through which the drain electrode DE passes.

The interlayer dielectric film ILD may be disposed on the gate electrode GE. For example, the interlayer dielectric film ILD may include a contact hole through which the source electrode SE passes, and a contact hole through which the drain electrode DE passes. The contact holes of the interlayer dielectric film ILD may be physically connected to those of the gate insulating film GI. Thus, the source electrode SE and the drain electrode DE may be electrically connected to the semiconductor layer ACT through the contact holes provided through the interlayer dielectric film ILD and the gate insulating film GE.

The first passivation layer PAS1 may be provided on the thin film transistor TFT to protect the thin film transistor TFT. For example, the first passivation layer PAS1 may include a contact hole through which the first electrode AE passes.

The first planarization layer OC1 may be provided on the first passivation layer PAS1 to planarize an upper surface of the thin film transistor TFT. For example, the first planarization layer OC1 may include a contact hole through which the first electrode AE of the light emitting member EL passes. The contact hole of the first planarization layer OC1 may be physically connected to that of the first passivation layer PAS2. Thus, the first electrode AE may be electrically connected to the drain electrode DE through the contact hole provided through the first planarization layer OC1 and the first passivation layer PAS2.

The light emitting diode layer EML may include a light emitting member EL, a first bank BNK1, a second bank BNK2, and a second passivation layer PAS2.

The light emitting member EL may be provided on the thin film transistor TFT. The light emitting member EL may include the first electrode AE, a second electrode CE, and an emission diode ED.

The first electrode AE may be provided on the first planarization layer OC1. For example, the first electrode AE may be disposed on the first bank BNK1, which is disposed on the first planarization layer OC1, and may cover (or overlap) the first bank BNK1 and a portion of the first planarization layer OC1 exposed by the first bank BNK1. The first electrode AE may overlap one of the first to third emission areas LA1, LA2, and LA3 defined by the second bank BNK2. For example, the first electrode AE may partially overlap each of the first to third emission areas LA1, LA2, and LA3. The first electrode AE may be electrically connected to the drain electrode DE of the thin film transistor TFT. The first electrode AE may be an anode electrode of the emission diode ED, but is not limited thereto.

The second electrode CE may be disposed on the first planarization layer OC1. For example, the second electrode CE may be disposed on the first bank BNK1, which is disposed on the first planarization layer OC1, and may cover the first bank BNK1 and a portion of the first planarization layer OC1 exposed by the first bank BNK1. The second electrode CE may overlap one of the first to third emission areas LA1, LA2, and LA3 defined by the second bank BNK2. For example, the second electrode CE may partially overlap each of the first to third emission areas LA1, LA2, and LA3. For example, the second electrode CE may receive a common voltage supplied to all pixels. The second electrode CE may be a cathode electrode of the emission diode ED, but is not limited thereto.

The first insulating layer IL1 may cover a portion of the first electrode AE and a portion of the second electrode CE, which are adjacent to each other. The first insulating layer IL1 may electrically insulate the first electrode AE from the second electrode CE.

The emission diode ED may be disposed between the first electrode AE and the second electrode CE. The emission diode ED may be disposed on the first planarization layer OC1. For example, the emission diode ED may be disposed on the first insulating layer ILL and the first insulating layer IL1 may be interposed between the first planarization layer OC1 and the first insulating layer IL1. An end portion of the emission diode ED may be electrically connected to the first electrode AE, and the another end portion of the emission diode ED may be electrically connected to the second electrode CE. For example, the emission diodes ED may include active layers having a same material to emit light a same wavelength range or light of a same color. The lights emitted from the first to third emission areas LA1, LA2, and LA3 may have the same color. For example, the emission diodes ED may emit of light of a third color or blue light, which has a peak wavelength in a range of about 440 nm to about 480 nm. Therefore, the light emitting diode layer EML may emit the light of the third color or the blue light.

The second bank BNK2 may be disposed on the first planarization layer OC1. Each of the first to third emission areas LA1, LA2, and LA3 is defined by adjacent ones of the second banks BNK2. For example, the second bank BNK2 may surround each of the first to third emission areas LA1, LA2, and LA3, but is not limited thereto. The first electrode AE or the second electrode CE of each of the light emitting members EL may be spaced apart from another first electrode AE or another second electrode CE of an adjacent light emitting member EL by the second bank BNK2. For example, the first electrode AE or the second electrode CE of each of the light emitting members EL may be electrically insulated from the another first electrode AE or the another second electrode CE of the adjacent light emitting member EL by the second bank BNK2. The second bank BNK2 may be disposed in the light blocking area BA.

The second passivation layer PAS2 may be disposed on the light emitting members EL and the second bank BNK2. The second passivation layer PAS2 may cover the light emitting members EL, and may protect the light emitting members EL. The second passivation layer PAS2 may prevent the permeation of water or air to protect the light emitting members EL from external water or air.

The display device 10 (refer to FIG. 2) may further include a second planarization layer OC2, a first capping layer CAP1, a first light blocking member BK1, a first wavelength converter WLC1, a second wavelength converter WLC2, a light transmissive part (or light transmissive unit) LTU, a second capping layer CAP2, a third planarization layer OC3, a second light blocking member BK2, first to third color filters CF1, CF2, and CF3, a third passivation layer PAS3, and an encapsulation layer ENC.

The second planarization layer OC2 may be provided on the light emitting diode layer EML to planarize an upper surface of the light emitting diode layer EML. For example, the light emitting diode layer EML may have a stepped cross-section, and the second planarization layer OC2 may fill the stepped cross-section to form a planar surface. The second planarization layer OC2 may include an organic material. For example, the second planarization layer OC2 may include at least one of acryl resin, epoxy resin, phenolic resin, polyamide resin and polyimide resin.

The first capping layer CAP1 may be disposed on the second planarization layer OC2. The first capping layer CAP1 may seal lower surfaces of the first and second wavelength converters WLC1 and WLC2 and the light transmissive part LTU. The first capping layer CAP1 may include an inorganic material. For example, the first capping layer CAP1 may include at least one of silicon nitride, aluminum nitride, zirconium nitride, titanium nitride, hafnium nitride, tantalum nitride, silicon oxide, aluminum oxide, titanium oxide, tin oxide, cerium oxide and silicon oxynitride.

The first light blocking member BK1 may be disposed in the light blocking area BA on the first capping layer CAP1.

The first light blocking member BK1 may overlap the second bank BNK2 in a thickness direction (or third direction DR3). The first light blocking member BK1 may block transmission of light. The first light blocking member BK1 may prevent color mixture of lights between adjacent ones of the first to third emission areas LA1, LA2, and LA3, thereby improving a color reproduction rate of the display device 10 (refer to FIG. 2). The first light blocking member BK1 may be arranged in a lattice shape to surround the first to third emission areas LA1, LA2, and LA3 in a plan view.

The first light blocking member BK1 may include an organic light blocking material and a liquid repellent material. The liquid repellent material may be made of a fluoride-containing monomer, or a fluoride-containing polymer. For example, the liquid repellent material may include a fluoride-containing aliphatic polycarbonate. For example, the first light blocking member BK1 may be made of a black organic material containing the liquid repellent material. The first light blocking member BK1 may be formed by coating and exposure processes of the organic light blocking material containing the liquid repellent material.

The first light blocking member BK1 may include the liquid repellent material. The first and second wavelength converters WLC1 and WLC2 and the light transmissive part LTU may be separated from one another by the first light blocking member BK1. Thus, the first and second wavelength converters WLC1 and WLC2 and the light transmissive part LTU may correspond to the first to third emission areas LA1, LA2, and LA3, respectively. For example, in case that the first and second wavelength converters WLC1 and WLC2 and the light transmissive part LTU are formed by an inkjet process, ink compositions dropped on an upper surface of the first light blocking member BK1 may flow into each of the first to third emission areas LA1, LA2, and LA3 by the liquid repellent material of the first light blocking member BK1. Thus, the first light blocking member BK1 may separate the ink compositions from each other to prevent mixture of ink compositions in adjacent ones of the first and second wavelength converters WLC1 and WLC2 and the light transmissive part LTU.

The first wavelength converter WLC1 may be disposed in the first emission area LA1 on the first capping layer CAP1. The first light blocking member BK1 may surround the first wavelength converter WLC1. The first wavelength converter WLC1 may include a first base resin BS1, a first scatterer SCT1, and a first wavelength shifter WLS1.

The first base resin BS1 may include a material having relatively high light transmittance. The first base resin BS1 may be made of a transparent organic material. For example, the first base resin BS1 may include at least one of epoxy resin, acrylic resin, cardo resin and imide resin.

The first scatterer SCT1 may have a different refractive index from that of the first base resin BS1. For example, an optical interface may be formed between the first scatterer SCT1 and the first base resin BS1. For example, the first scatterer SCT1 may include a light scattering material or light scattering particles, which scatters (or scatter) at least a portion of transmissive light (or incident light) which is incident into the first wavelength converter WLC1. For example, the first scatterer SCT1 may include a metal oxide such as $TiO_2$, $ZrO_2$, $Al_2O_3$, $In_2O_3$, ZnO, $SnO_2$, and a combination thereof, or may include organic particles comprising a polymer resin such as acrylic resin or urethane resin. The first scatterer SCT1 may scatter the incident light in a random direction regardless of an incident angle without substantially converting a peak wavelength of the incident light.

The first wavelength shifter WLS1 may convert or shift the peak wavelength of the incident light to a first peak wavelength. For example, the first wavelength shifter WLS1 may convert the blue light emitted by the emission diodes ED of the display device 10 (refer to FIG. 2) to red light having a single peak wavelength in a range of about 610 nm to about 650 nm and emit the converted light. The first wavelength shifter WLS1 may be a quantum dot, a quantum rod, or a fluorescent body. The quantum dot may be a granular material for emitting a color light by transiting electrons from a conduction band to a valence band.

For example, the quantum dot may be a semiconductor nanocrystalline material. The quantum dot may have a band gap based on composition and size thereof. The quantum dot may absorb the incident light (e.g. blue light) to emit the converted light (e.g. red light) having a wavelength corresponding to the band gap. Examples of the semiconductor nanocrystalline material of the quantum dot may include group IV nanocrystalline material, group IV nanocrystalline compound, group II-VI nanocrystalline compound, group III-V nanocrystalline compound, group IV-VI nanocrystalline compound or their combination.

The group II-VI nanocrystalline compound may include at least one binary compound selected from the group of CdSe, CdTe, ZnS, ZnSe, ZnTe, ZnO, HgS, HgSe, HgTe, MgSe, and MgS, at least one ternary compound selected from the group of InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS, or at least one quaternary compound selected from the group of HgZnTeS, CdZnSeS, CdZnSeTe, CdZnSTe, CdHgSeS, CdHgSeTe, CdHgSTe, HgZnSeS, HgZnSeTe, and HgZnSTe. For example, the group II-IV nanocrystalline compound may include a mixture of the above-mentioned compounds.

The group III-V nanocrystalline compound may include at least one binary compound selected from the group of GaN, GaP, GaAs, GaSb, AlN, AlP, AlAs, AlSb, InN, InP, InAs, and InSb, at least one ternary compound selected from the group of GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and GaAlNP, and at least one quaternary compound selected from the group of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb. For example, the group II-IV nanocrystalline compound may include a mixture of the above-mentioned compounds.

The group IV-VI nanocrystalline compound may include at least one binary compound selected from the group of SnS, SnSe, SnTe, PbS, PbSe, and PbTe, at least one ternary compound selected from the group of SnSeS, SnSeTe, SnSTe, PbSeS, PbSeTe, PbSTe, SnPbS, SnPbSe, and SnPbTe, and at least one quaternary compound selected from the group of SnPbSSe, SnPbSeTe, and SnPbSTe. For example, the group IV-VI nanocrystalline compound may include a mixture of the above-mentioned compound. The group IV nanocrystalline material may include at least one selected from the group of Si, and Ge. The group IV nanocrystalline compound may include at least one binary compound selected from the group of SiC, and SiGe. For example, the group IV nanocrystalline compound may include a mixture of the above-mentioned compounds.

For example, the binary compounds, the ternary compounds, or the quaternary compounds may be disposed in each of the quantum dots at a uniform concentration. In another example, the binary compounds, the ternary compounds, or the quaternary compounds may concentrate on a certain portion of the quantum dot.

For example, the quantum dot may have a core-shell structure that includes a core having the nanocrystalline material and a shell surrounding the core. The shell of the quantum dot may protect the core, and prevent the chemical deterioration of the core to maintain semiconductor characteristics of the core. The shell may also be implemented with, for example, a charging layer, and thus the quantum dot may have electrophoresis characteristics. The shell may include a single layer or multiple layers. The shell of the quantum dot may be made of a metal oxide, or a nonmetal oxide, a semiconductor compound, or a combination thereof. A concentration gradient may be formed at an interface between the core and the shell. For example, a concentration of the material (the metal oxide, the nonmetal oxide, the semiconductor oxide, etc.) at the interface may be smaller than that of an outer surface of the shell.

For example, examples of the metal oxide or the nonmetal oxide of the shell may include at least one binary compound selected from the group of $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or at least one ternary compound selected from the group of $MgAl_2O_4$, $CoFe_2O_4$, $NiFe_2O_4$, and $CoMn_2O_4$. For example, the shell may include a mixture of the above-mentioned compounds, but the disclosure is not limited thereto.

Also, examples of the semiconductor compound of the shell may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or a mixture thereof, but the disclosure is not limited thereto.

The converted light (e.g. red light) emitted from the first wavelength shifter WLS1 may have a full width of half maximum (FWHM) of 45 nm or less, 40 nm or less, or 30 nm or less in an emission wavelength spectrum. The first wavelength shifter WLS1 may improve color purity and color reproduction of the display device 10. The converted light emitted from the first wavelength shifter WLS1 may be emitted in various directions regardless of the incident angle of the incident light (e.g. blue light). Therefore, lateral visibility (e.g. viewing angle) of a red color displayed in the first emission area LA1 may be improved.

A portion of the blue light emitted from the light emitting diode layer EML may not be converted into the red light by the first wavelength converter WLC1, and may pass through the first wavelength converter WLC1. The portion of the blue light, which is not converted by the first wavelength converter WLC1, may be incident into the first color filter CF1. The color filter CF1 may block the portion of the blue light, and may transmit the red light converted by the first wavelength converter WLC1. Among the blue light provided by the display device 10, only the red light converted by the first wavelength converter WLC1 may exit the first color filter CF1. Therefore, the first emission area LA1 may emit the red light.

The second wavelength converter WLC2 may be disposed in the second emission area LA2 on the first capping layer CAP1. The first light blocking member BK1 may surround the second wavelength converter WLC2. The second wavelength converter WLC2 may include a second base resin BS2, a second scatterer SCT2, and a second wavelength shifter WLS2.

The second base resin BS2 may include a material having relatively high light transmittance. The second base resin BS2 may be made of a transparent organic material. For example, the second base resin BS2 may be made of the same material as that of the first base resin BS1. In another example, the second base resin BS2 may include different material from the first base resin BS1. The second base resin BS2 may be made of at least one transparent organic material selected from the group of epoxy resin, acrylic resin, cardo resin, and imide resin.

The second scatterer SCT2 may have a different refractive index from that of the second base resin BS2. For example, an optical interface may be formed between the second scatterer SCT2 and the second base resin BS2. For example, the second scatterer SCT2 may include a light scattering material or light scattering particles, which scatters (or scatter) at least a portion of transmissive light (or incident light) which is incident into the second wavelength converter WLC2. For example, the second scatterer SCT2 may be made of the same material as that of the first scatterer SCT1. In another example, the second scatterer SCT2 may include different material from the that of first scatterer SCT1. The second scatterer SCT2 may be made of a metal oxide such as $TiO_2$, $ZrO_2$, $Al_2O_3$, $In_2O_3$, ZnO, $SnO_2$, and a combination thereof, or may include organic particles comprising a polymer resin such as acrylic resin or urethane resin. The second scatterer SCT2 may scatter the incident light in a random direction regardless of an incident angle without substantially converting a peak wavelength of the incident light.

The second wavelength shifter WLS2 may convert or shift the peak wavelength of the incident light to a second peak wavelength. The second peak wavelength may be different from the first peak wavelength of the first wavelength shifter WLS1. For example, the second wavelength shifter WLS2 may convert the blue light emitted by the emission diodes ED of the display device 10 (refer to FIG. 2) to green light having a single peak wavelength in a range of about 510 nm to about 650 nm and emit the converted light. The second wavelength shifter WLS2 may be (or include) a quantum dot, a quantum rod, or a fluorescent body. The second wavelength shifter WLS2 may include the same material as that of the first wavelength shifter WLS1. For example, the second wavelength shifter WLS2 may include different material from that of the first wavelength shifter WLS1. The second wavelength shifter WLS2 may include a quantum dot, a quantum rod or a fluorescent body, and may have a different wavelength conversion range from that of the first wavelength shifter WLS1.

The light transmissive part LTU may be disposed in the third emission area LA3 on the first capping layer CAP1. The first light blocking member BK1 may surround the light transmissive part LTU. The light transmissive part LTU may transmit the incident light. The light transmissive part LTU may not convert a peak wavelength of the incident light, and maintain the peak wavelength of the incident light. The light transmissive part LTU may include a third base resin BS3 and a third scatterer SCT3.

The third base resin BS3 may include a material having relatively high light transmittance. The third base resin BS3 may be made of a transparent organic material. For example, the third base resin BS3 may be made of the same material as that of the first or second base resin BS1 or BS2. In another example, the third base resin BS3 may include different material from those of the first or second base resin BS1 or BS2. The third base resin BS3 may be made of at least one transparent organic material selected from the group of epoxy resin, acrylic resin, cardo resin, and imide resin.

The third scatterer SCT3 may have a different refractive index from that of the third base resin BS3. For example, an optical interface may be formed between the third scatterer SCT3 and the third base resin BS3. For example, the third scatterer SCT3 may include a light scattering material or light scattering particles, which scatters (or scatter) at least a portion of transmissive light (or incident light) which is incident into the light transmissive part LTU. For example, the third scatterer SCT3 may be made of the same material as that of the first or second scatterer SCT1 or SCT2. In another example, the third scatterer SCT3 may include different material from that of the first or second scatterer SCT1 or SCT2. The third scatterer SCT3 may be made of a metal oxide such as $TiO_2$, $ZrO_2$, $Al_2O_3$, $In_2O_3$, ZnO, $SnO_2$, and a combination thereof, or may include organic particles comprising a polymer resin such as acrylic resin or urethane resin. The third scatterer SCT3 may scatter the incident light in a random direction regardless of an incident angle without substantially converting a peak wavelength of the incident light.

The first and second wavelength converters WLC1 and WLC2 and the light transmissive part LTU may be disposed on the light emitting diode layer EML, and the second planarization layer OC2 and the first capping layer CAP1 may cover the light emitting diode layer EML to planarize the upper surface of the light emitting diode layer EML. Thus, the display device 10 (e.g., refer to FIG. 2) may not need a separate substrate for forming the first and second wavelength converters WLC1 and WLC2 and the light transmissive part LTU thereon. Therefore, the first and second wavelength converters WLC1 and WLC2 and the light transmissive part LTU may be aligned in each of the first to third emission areas LA1, LA2, and LA3, and a thickness of the display device 10 may be reduced.

The second capping layer CAP2 may cover the first and second wavelength converters WLC1 and WLC2, the light transmissive part LTU, and the first light blocking member BK1. For example, the second capping layer CAP2 may seal the first and second wavelength converters WLC1 and WLC2 and the light transmissive part LTU to prevent contamination of the first and second wavelength converters WLC1 and WLC2 and the light transmissive part LTU. The second capping layer CAP2 may be made of the same material as that of the first capping layer CAP1. In another example, the second capping layer CAP2 may include different material from that of the first capping layer CAP1. For example, the first capping layer CAP2 may include at least one of silicon nitride, aluminum nitride, zirconium nitride, titanium nitride, hafnium nitride, tantalum nitride, silicon oxide, aluminum oxide, titanium oxide, tin oxide, cerium oxide and silicon oxynitride.

The third planarization layer OC3 may be disposed on the second capping layer CAP2 to planarize upper surfaces of the first and second wavelength converters WLC1 and WLC2 and the light transmissive part LTU. For example, the first and second wavelength converters WLC1 and WLC2, the light transmissive part LTU, and the first light blocking member BK1 may form a stepped cross-section, and the third planarization layer OC3 may fill the stepped cross-section to form a planar surface. The third planarization layer OC3 may include an organic material. For example, the third planarization layer OC3 may include at least one of acryl resin, epoxy resin, phenolic resin, polyamide resin and polyimide resin.

The second light blocking member BK2 may be disposed in the light blocking area BA on the third planarization layer OC3. The second light blocking member BK2 may overlap the first light blocking member BK1 or the second bank BNK2 in a thickness direction (or third direction DR3). The second light blocking member BK2 may block transmission of light. The second light blocking member BK2 may prevent the color mixture of lights between adjacent ones of the first to third emission areas LA1, LA2, and LA3, thereby improving the color reproduction rate of the display device 10 (e.g., refer to FIG. 2). The second light blocking member BK2 may be arranged in a lattice shape to surround the first to third emission areas LA1, LA2, and LA3 in the plan view.

The first color filter CF1 may be disposed in the first emission area LA1 on the third planarization layer OC3. The second light blocking member BK2 may surround the first color filter CF1. The first color filter CF1 may overlap the first wavelength converter WLC1 in the thickness direction (or third direction DR3). The first color filter CF1 may selectively transmit the light of the first color (for example, red light), and may block or absorb the light of the second color (for example, green light) and the light of the third color (for example, blue light). For example, the first color filter CF1 may be a red color filter, and may include a red colorant. The red colorant may be comprised of a red dye or a red pigment.

The second color filter CF2 may be disposed in the second emission area LA2 on the third planarization layer OC3. The second light blocking member BK2 may surround the second color filter CF2. The second color filter CF2 may overlap the second wavelength converter WLC2 in the thickness direction (or third direction DR3). The second color filter CF2 may selectively transmit the converted light of the second color (for example, green light), and may block or absorb the light of the first color (for example, red light) and the light of the third color (for example, blue light). For example, the second color filter CF2 may be a green color filter, and may include a green colorant. The green colorant may be comprised of a green dye or a green pigment.

The third color filter CF3 may be disposed in the third emission area LA3 on the third planarization layer OC3. The second light blocking member BK2 may surround the third color filter CF3. The third color filter CF3 may overlap the light transmissive part LTU in the thickness direction (or third direction DR3). The third color filter CF3 may selectively transmit the light of the third color (for example, blue light), and may block or absorb the light of the first color (for example, red light) and the light of the second color (for example, green light). For example, the third color filter CF3 may be a blue color filter, and may include a blue colorant. The blue colorant may be comprised of a blue dye or a blue pigment.

The first to third color filters CF1, and CF3 may absorb a portion of external light, which is from the outside of the display device 10 (e.g., refer to FIG. 2), and may reduce the reflection of the external light on the outer surface of the display device 10 (e.g., refer to FIG. 2). Therefore, the first to third color filters CF1, CF2, and CF3 may prevent color distortion caused by the reflection of the external light.

The first to third color filters CF1, CF2, and CF3 may be disposed on the first and second wavelength converters WLC1 and WLC2 and the light transmissive part LTU, and the third planarization layer OC3 may cover the first and second wavelength converters WLC1 and WLC2, the light transmissive part LTU, and the second light blocking member BK2 to planarize upper surfaces thereof. For example, the first and second wavelength converters WLC1 and WLC2, the light transmissive part LTU, and the second light blocking member BK2 may form a stepped cross-section, and the third planarization layer OC3 may fill the stepped cross-section to form the planar surface. Thus, the display device 10 (e.g., refer to FIG. 2) may not need a separate substrate for forming the first to third color filters CF1, CF2, and CF3. Therefore, the thickness of the display device 10 may be reduced.

The third passivation layer PAS3 may cover the first to third color filters CF1, CF2, and CF3. The third passivation layer PAS3 may protect the first to third color filters CF1, CF2, and CF3.

The encapsulation layer ENC may be disposed on the third passivation layer PAS3. For example, the encapsulation layer ENC may include at least one inorganic film, and prevent the permeation of oxygen or water. Also, the encapsulation layer ENC may include at least one organic film, and protect the display device 10 from particles such as dust.

Figure 4:
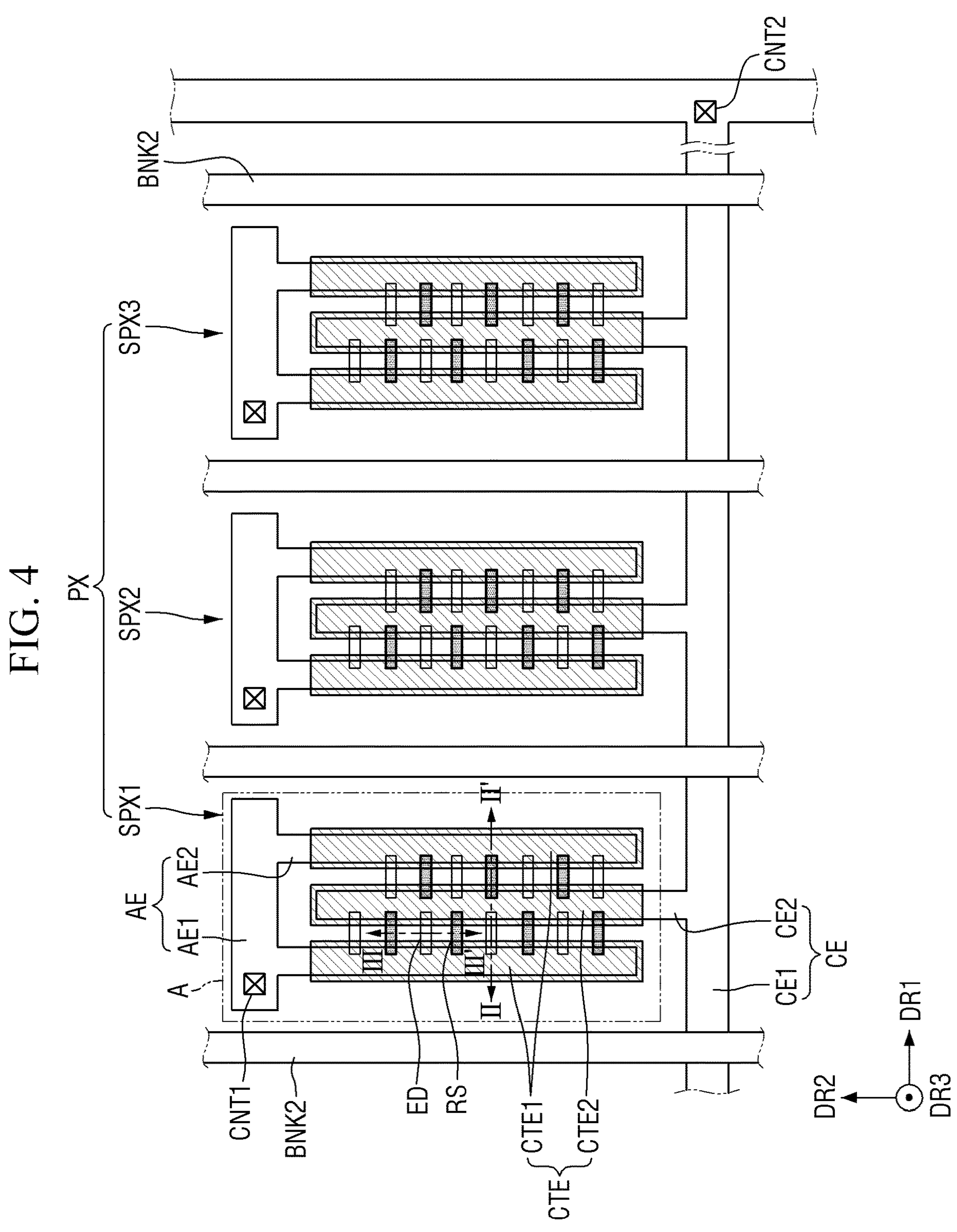
FIG. 4 is a schematic plan view illustrating a pixel of a display device according to an embodiment of the disclosure.

FIG. 4 is a schematic plan view illustrating a pixel of a display device according to an embodiment of the disclosure.

Referring to FIG. 4, pixels PX of a display device 10 (e.g., refer to FIG. 2) may include first to third subpixels SPX1, SPX2 and SPX3. The first to third subpixels SPX1, SPX2 and SPX3 may respectively correspond to first to third emission areas LA1, LA2 and LA3 (e.g., refer to FIG. 3). An emission diode ED of each of the first to third subpixels SPX1, SPX2, and SPX3 may emit light through the first to third emission areas LA1, LA2, and LA3.

The light emitted from the first to third subpixels SPX1, SPX2, and SPX3 may have a same color. For example, the first to third subpixels SPX1, SPX2, and SPX3 may include the same type of emission diode ED, and may emit light of the third color or blue light. In another example, the first subpixel SPX1 may emit light of the first color or red light, the second subpixel SPX2 may emit light of the second color or green light, and the third subpixel SPX3 may emit light of the third color or blue light.

The first to third subpixels SPX1, SPX2, and SPX3 may include first and second electrodes AE and CE, an emission diode ED, contact electrodes CTE, and second banks BNK2.

The first and second electrodes AE and CE may be electrically connected to the emission diode ED, and may receive a voltage. The emission diode ED may emit light having a wavelength range. At least a portion of the first and second electrodes AE and CE may form an electric field in the pixel PX, and the emission diode ED may be aligned by the electric field.

For example, the first electrodes AE of the first to third subpixels SPX1, SPX2, and SPX3 may be pixel electrodes separated from each other, and the second electrode CE may be a common electrode electrically connected to the first to third subpixels SPX1, SPX2, and SPX3. One of the first and second electrodes AE and CE may be an anode electrode of the emission diode ED, and another one of the first and second electrodes AE and CE may be a cathode electrode of the emission diode ED.

The first electrode AE may include a first electrode stem portion AE1 extended in the first direction DR1, and at least one first electrode branch portion AE2 diverged from the first electrode stem portion AE1 and extended in the second direction DR2.

The first electrode stem portion AE1 of each of the first to third subpixels SPX1, SPX2, and SPX3 may be spaced apart from another first electrode stem portion AE1 of adjacent one of the first to third subpixels SPX1, SPX2, and SPX3. First electrode stem portions AE1 of adjacent ones of the first to third subpixels SPX1, SPX2, and SPX3 may be arranged along a virtual extension line extended in the first direction DR1. The first electrode stem portions AE1 of the first to third subpixels SPX1, SPX2, and SPX3 may receive signals different from one another, and may be independently operated.

The first electrode branch portion AE2 may be diverged from the first electrode stem portion AE1 and extended in the second direction DR2. An end portion of the first electrode branch portion AE2 may be electrically connected to the first electrode stem portion AE1, and another end portion of the first electrode branch portion AE2 may be spaced apart from a second electrode stem portion CE1 opposing or facing the first electrode stem portion AE1.

The second electrode CE may include a second electrode stem portion CE1 extended in the first direction DR1, and a second electrode branch portion CE2 diverged from the second electrode stem portion CE1 and extended in the second direction DR2. The second electrode stem portion CE1 of each of the first to third subpixels SPX1, SPX2, and SPX3 may be electrically connected to another second electrode stem portion CE1 of adjacent one of the first to third subpixels SPX1, SPX2, and SPX3. The second electrode stem portion CE1 may be extended in the first direction DR1, and may cross the pixels PX. The second electrode stem portions CE1 may extend toward an outer portion of the display area DA (e.g., refer to FIG. 2) or the non-display area NDA (e.g., refer to FIG. 2) in the first direction DR1. For example, the second electrode stem portions CE1 may be electrically connected to lines or elements (not illustrated) disposed on the outer portion of the display area DA (e.g., refer to FIG. 2) or the non-display area NDA (e.g., refer to FIG. 2).

The second electrode branch portion CE2 may be spaced apart from the first electrode branch portion AE2, and may face the first electrode branch portion AE2. An end portion of the second electrode branch portion CE2 may be electrically connected to the second electrode stem portion CE1, and another end portion of the second electrode branch portion CE2 may be spaced apart from the first electrode stem portion AE1.

The first electrode AE may be electrically connected to the thin film transistor layer TFTL of the display device 10 through a first contact hole CNT1, and the second electrode CE may be electrically connected to the thin film transistor layer TFTL of the display device 10 through a second contact hole CNT2. For example, the first contact hole CNT1 may be disposed in each of the first electrode stem portions AE1, and the second contact hole CNT2 may be disposed in the second electrode stem portions CE1, but the contact holes are not limited thereto.

The second bank BNK2 may be disposed on a boundary between adjacent ones of the pixels PX. The first electrode stem portions AE1 may be spaced apart from each other by the second bank BNK2. The second bank BNK2 may be extended in the second direction DR2, and may be disposed on the boundary between adjacent pixels PX arranged in the first direction DR1. The second bank BNK2 may also be disposed on the boundary between adjacent pixels PX arranged in the second direction DR2. The second bank BNK2 may define the boundary of the pixels PX.

In manufacturing process of the display device 10 (refer to FIG. 2), an ink may be dropped in each of the pixels PX through inkjet processes. The second bank BNK2 may prevent scattering of inks out of the boundary of the dropped pixel PX toward another pixel PX adjacent to the dropped pixel PX. The second bank BNK2 may separate the inks dropped on different emission diodes ED from each other, and prevent the mixture of the inks dropped on the different emission diodes ED.

The emission diode ED may be disposed between the first electrode AE and the second electrode CE. An end portion of the emission diode ED may be electrically connected to the first electrode AE, and the another end portion of the emission diode ED may be electrically connected to the second electrode CE. For example, the emission diode ED may be electrically connected to the first electrode AE through the first contact electrode CTE1, and may be electrically connected to the second electrode CE through the second contact electrode CTE2. The emission diode ED may have an extended shape extended in the first direction DR1. For example, the emission diode ED may include a long side extended in the first direction DR1 and a short side extended in the second direction DR2 in a plan view.

The emission diodes ED may be spaced apart from each other, and may substantially be aligned in parallel with each other. An interval between adjacent ones of the emission diodes ED may not be limited. Some of the emission diodes ED may be adjacent to each other, some emission diodes ED may be spaced apart from each other at a constant interval, and some emission diodes ED may be arranged in an irregular arrangement but may be aligned in a same direction. For example, the emission diodes ED may be disposed in a direction (e.g. first direction DR1) perpendicular to the extending direction (e.g. second direction DR2) of the first electrode branch portion AE2 or the second electrode branch portion CE2. In another example, the emission diodes ED may be disposed in an oblique direction with respect to the extending direction (e.g. second direction DR2) of the first electrode branch portion AE2 or the second electrode branch portion CE2.

The emission diodes ED may include active layers having a same material to emit light of a same wavelength range or light of a same color. The first to third subpixels SPX1, SPX2, and SPX3 may emit the light of the same color. For example, the emission diodes ED may emit the light of the third color or the blue light having the peak wavelength in a range of about 440 nm to about 480 nm. Therefore, the light emitting diode layer EML (e.g., refer to FIG. 3) of the display device 10 (e.g., refer to FIG. 2) may emit the light of the third color or the blue light. In another example, the first to third subpixels SPX1, SPX2, and SPX3 may include the emission diodes ED having different active layers from each other to emit lights of different colors.

The contact electrode CTE may include first and second contact electrodes CTE1 and CTE2. The first contact electrode CTE1 may cover a portion of the first electrode branch portion AE2 and the emission diode ED, and may electrically connect the first electrode branch portion AE2 to the emission diode ED. For example, the first contact electrode CTE1 may electrically connect the first branch portion AE2 to an end portion of the emission diode ED. The second contact electrode CTE2 may cover another portion of the second electrode branch portion CE2 and the emission diode ED, and may electrically connect the second electrode branch portion CE2 to the emission diode ED. For example, the second contact electrode CTE2 may electrically connect the second electrode branch portion CE2 to the another end portion of the emission diode ED.

The first contact electrode CTE1 may be disposed on the first electrode branch portion AE2 and extended in the second direction DR2. The first contact electrode CTE1 may contact (e.g. directly contact) an end portion of the emission diode ED. The emission diode ED may be electrically connected to the first electrode AE through the first contact electrode CTE1. For example, the end portion of the emission diode ED may be electrically connected to the first electrode AE through the first contact electrode CTE1.

The second contact electrode CTE2 may be disposed on the second electrode branch portion CE2 and extended in the second direction DR2. The second contact electrode CTE2 may be spaced apart from the first contact electrode CTE1 in the first direction DR1. The second contact electrode CTE2 may contact (e.g. directly contact) the another end portion of the emission diode ED. The emission diode ED may be electrically connected to the second electrode CE through the second contact electrode CTE2. For example, the another end portion of the emission diode ED may be electrically and physically connected to the second electrode CE through the second contact electrode CTE2.

For example, a width of each of the first and second contact electrodes CTE1 and CTE2 may be greater than that of each of the first and second electrode branch portions AE2 and CE2. The first and second contact electrodes CTE1 and CTE2 may entirely cover (or overlap) the first and second electrode branch portions AE2 and CE2, respectively. In another example, the first and second contact electrodes CTE1 and CTE2 may partially overlap the first and second electrode branch portions AE2 and CE2, respectively, and the first and second contact electrodes CTE1 and CTE2 may overlap one side of each of the first and second electrode branch portions AE2 and CE2.

The display device 10 (refer to FIG. 2) may further include a reflective structure RS disposed between the first electrode AE and the second electrode CE. The reflective structure RS may be spaced apart from the emission diode ED. The emission diode ED and the reflective structure RS may be spaced apart from each other along the second direction DR2. For example, the display device (refer to FIG. 2) may further include multiple reflective structures RS. The emission diodes ED and the reflective structures RS may be alternately disposed along the second direction DR2. The emission diode ED may be disposed between adjacent ones of the reflective structures RS.

The emission diode ED, as shown in FIG. 4, may include a long side extended in the first direction DR1 and a short side extended in the second direction DR2. The emission diode ED may generally have a line shape extended in the first direction DR1. The light generated from the emission diode ED may be emitted through end portions of the long side and end portions of the short side. The light emitted through the end portions of the short side of the emission diode ED may be reflected by the first and second electrodes AE and CE, and may be guided toward an upper direction (or third direction DR3). Thus, luminance of the light emitted toward the upper direction may be increased at the end portions of the short side of the emission diode ED. In another example, in case that there is no member (e.g. an optical element) for guiding the lights emitted through the end portions of the long side toward the upper direction (or third direction DR3), the lights may be emitted in various directions (e.g. a horizontal direction, a diagonal direction, etc.), and thus, luminance of light emitted toward the upper direction may be deteriorated at the end portions of the long side of the emission diode ED. However, since the display device 10 (refer to FIG. 2) according to an embodiment further includes the reflective structure RS disposed between adjacent ones of the emission diodes ED, the reflective structure RS may reflect the lights emitted from the end portions of the long side of the emission diode ED toward the upper direction. Thus, luminance of the display device 10 (refer to FIG. 2) toward the upper direction may be improved at the end portions of the long side of the emission diode ED.

Figure 5:
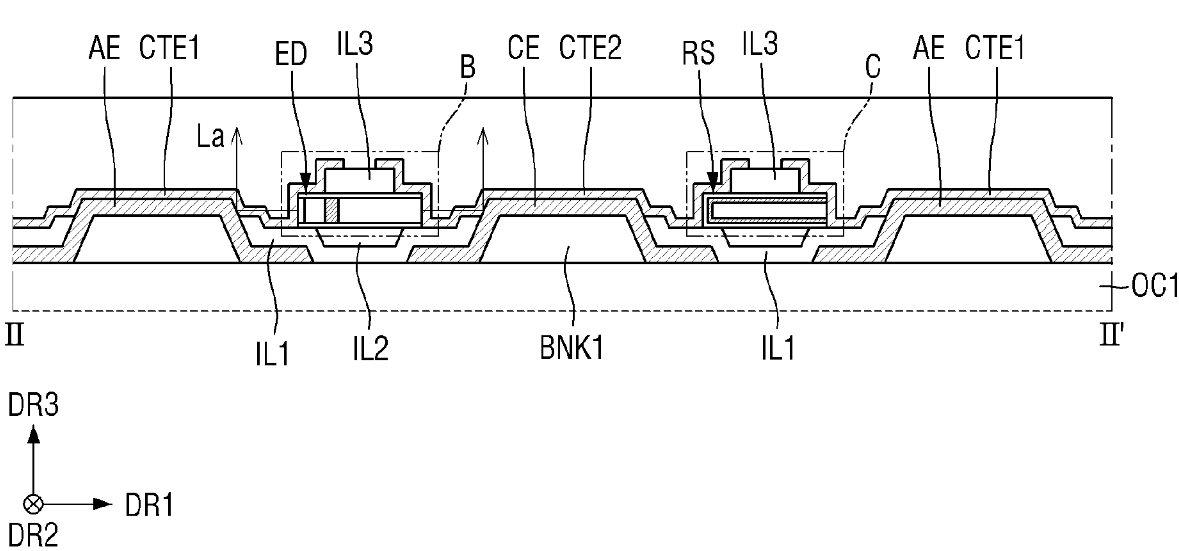
FIG. 5 is a schematic cross-sectional view taken along line II-II' of FIG. 4.
Figure 6:
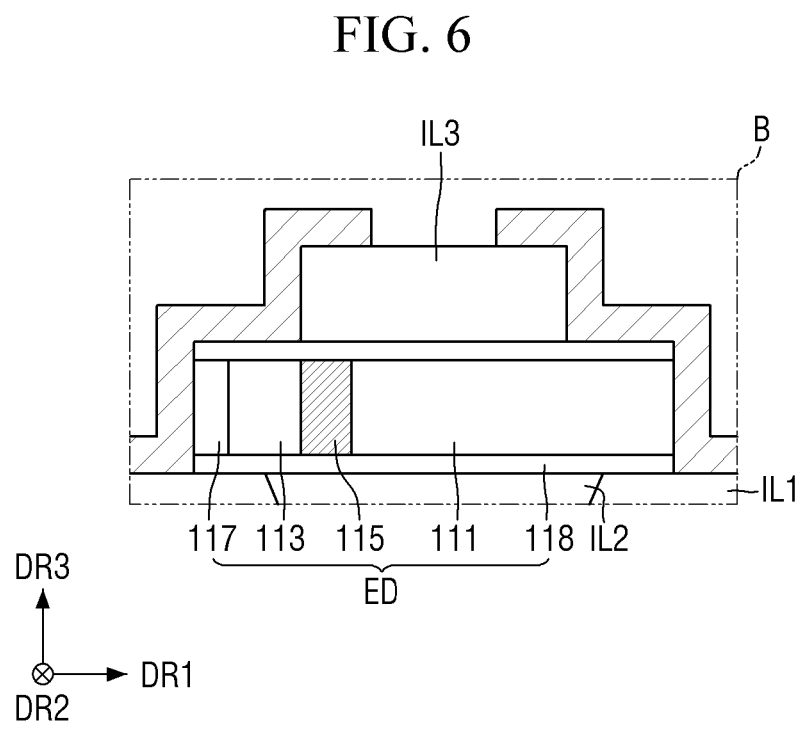

FIG. 5 is a schematic cross-sectional view taken along line II-II' of FIG. 4. FIG. 6 is a schematic enlarged cross-sectional view illustrating area B of FIG. 5.

Referring to FIGS. 4 to 6, the light emitting diode layer EML (refer to FIG. 3) of the display device 10 (refer to FIG. 2) may be disposed on the thin film transistor layer TFTL (refer to FIG. 3), and may include first to third insulating layers ILL IL2, and IL3.

The first banks BNK1 may be disposed in each of the first to third emission areas LA1, LA2, and LA3 (refer to FIG. 3). The first banks BNK1 may correspond to the first electrode AE or the second electrode CE. Each of the first and second electrodes AE and CE may be disposed on the first bank BNK1. For example, each of the first and second electrode branch portions AE2 and CE2 may be disposed on the first bank BNK1. For example, each of the first and second electrode branch portions AE2 and CE2 may cover an upper surface and a side surface of the first banks BNK1. The first bank BNK1 may include polyimide (PI), but is not limited thereto.

The first banks BNK1 may be disposed on the first planarization layer OC1, and the side surface of each of the first banks BNK1 may be inclined with respect to an upper surface of the first planarization layer OC1. For example, the inclined surface of each of the first banks BNK1 and the upper surface of the first planarization layer OC1 may form an acute angle. The inclined surface of the first bank BNK1 may reflect the light emitted from the emission diode ED. For example, the first and second electrodes AE and CE may include a material having high reflectivity, and may be disposed on the inclined surface of the first bank BNK1 to reflect the light emitted from the emission diode ED toward the upper direction (e.g. third direction DR3) of the display device 10.

The first electrode stem portion AE1 may include a first contact hole CNT1 that passes through the first planarization layer OC1. For example, a portion of the first electrode stem portion AE1 may be disposed in the first contact hole CNT1. The first electrode stem portion AE1 may be electrically connected to the thin film transistor TFT through the first contact hole CNT1. Therefore, the first electrode AE may receive an electrical signal from the thin film transistor TFT.

The second electrode stem portion CE1 may be extended in the first direction DR1 toward the non-emission area NDA (e.g., refer to FIG. 2) in which the emission diode ED is not disposed. The second electrode stem portion CE1 may overlap a second contact hole CNT2 that passes through the first planarization layer OC1. The second electrode stem portion CE1 may be electrically connected to a power electrode through the second contact hole CNT2. The second electrode CE may receive an electrical signal from the power electrode.

The first and second electrodes AE and CE may include a transparent conductive material. For example, the first and second electrodes AE and CE may include at least one of Indium Tin Oxide (ITO), Indium Zinc Oxide (IZO), and Indium Tin-Zinc Oxide (ITZO).

The first and second electrodes AE and CE may include a conductive material having high reflectivity. For example, the first and second electrodes AE and CE may include a metal, such as Ag, Cu, Al, or the like, which has high reflectivity. The first and second electrodes AE and CE may reflect the incident light generated from the emission diode ED toward the upper direction (e.g. third direction DR3) of the display device 10 (e.g., refer to FIG. 2).

The first and second electrodes AE and CE may have a deposited structure (e.g. stacked structure) of one or more layers, which are comprised of a transparent conductive material and a metal having high reflectivity. For example, the first and second electrodes AE and CE may be formed as a same layer that includes at least one of the transparent conductive material and the metal. For example, the first and second electrodes AE and CE may have a deposited structure (e.g. stacked structure) of ITO/Ag/ITO/IZO, or may be made of an alloy including Al, Ni, La, etc., but are not limited thereto.

The first insulating layer IL1 may be disposed on the first planarization layer OC1, the first electrode AE, and the second electrode CE. The first insulating layer IL1 may cover (or overlap) a portion of each of the first and second electrodes AE and CE. For example, the first insulating layer IL1 may expose remaining portions of the first and second electrodes AE and CE, which correspond to an upper surface of the first bank BNK1. For example, the first insulating layer IL1 may cover the portions of first and second electrodes AE and CE, which do not correspond to the upper surface of the first bank BNK1. Therefore, the first insulating layer IL1 may include an opening that exposes the remaining portions of first and second electrodes AE and CE, which correspond to the upper surface of the first bank BNK1.

For example, the first insulating layer IL1 may include an inorganic insulating material. For example, the first and second electrodes AE and CE are spaced apart from each other to form a stepped structure having a recessed portion on the first planarization layer OC1. Thus, the first insulating layer IL1 may include a recessed step having a step difference (or height difference) recessed between the first and second electrodes AE and CE. The second insulating layer IL2 may fill the recessed step of the first insulating layer ILL Therefore, the second insulating layer IL2 may planarize an upper surface of the first insulating layer ILL and the emission diode ED may be disposed on the first and second insulating layers IL1 and IL2.

The first insulating layer IL1 may protect the first and second electrodes AE and CE, and may electrically insulate the first electrode AE from the second electrode CE. The first insulating layer IL1 may protect the emission diode ED from other members (e.g. the first and second electrodes AE and CE) to prevent damage of the emission diode ED.

The emission diode ED may be disposed between the first electrode AE and the second electrode CE on the first and second insulating layers IL1 and IL2. An end portion of the emission diode ED may be electrically connected to the first electrode AE, and the another end portion of the emission diode ED may be electrically connected to the second electrode CE. For example, the emission diode ED may be electrically connected to the first electrode AE through the first contact electrode CTE1, and may be electrically connected to the second electrode CE through the second contact electrode CTE2. For example, an end portion of the short side of the emission diode ED may be electrically connected to the first electrode AE through the first contact electrode CTE1, and the another end portion of the short side of the emission diode ED may be electrically connected to the second electrode CE through the second contact electrode CTE2.

The first electrode AE and the second electrode CE may reflect the light generated from the emission diode ED toward the upper direction (e.g. third direction DR3) of the display device 10 (refer to FIG. 2). For example, as shown in FIG. 5, light La may be emitted through the end portion of the short side of the emission diode ED and the another end portion of the short side of the emission diode ED. The light La emitted through the end portions of the short side of the emission diode ED may be reflected from the first and second electrodes AE and CE toward the upper direction (e.g. third direction DR3).

The third insulating layer IL3 may partially overlap the emission diode ED and may be disposed on the emission diode ED disposed between the first and second electrodes AE and CE. The third insulating layer IL3 may partially surround an outer surface of the emission diode ED to protect the emission diode ED. For example, the third insulating layer IL3 may surround the outer surface of the emission diode ED.

The contact electrode CTE may include first and second contact electrodes CTE1 and CTE2. The first contact electrode CTE1 may cover a portion of the first electrode branch portion AE2 and the emission diode ED, and may electrically connect the first electrode branch portion AE2 to the emission diode ED. For example, the first contact electrode CTE1 may electrically connect the first electrode branch portion AE2 to the end portion of the emission diode ED. The second contact electrode CTE2 may cover another portion of the second electrode branch portion CE2 and the emission diode ED, and may electrically connect the second electrode branch portion CE2 with the emission diode ED. For example, the second contact electrode CTE2 may electrically connect the second electrode branch portion CE2 to the another end portion of the emission diode ED.

The first contact electrode CTE1 may be disposed on the first electrode branch portion AE2 and extended in the second direction DR2. The first contact electrode CTE1 may contact (e.g. directly contact) the end portion of the emission diode ED. The emission diode ED may be electrically connected to the first electrode AE through the first contact electrode CTE1.

The second contact electrode CTE2 may be disposed on the second electrode branch portion CE2 and extended in the second direction DR2. The second contact electrode CTE2 may be spaced apart from the first contact electrode CTE1 in the first direction DR1. The second contact electrode CTE2 may contact (e.g. directly contact) the another end portion of the emission diode ED. The emission diode ED may be electrically connected to the second electrode CE through the second contact electrode CTE2.

The contact electrode CTE may include a conductive material. For example, the contact electrode CTE may include ITO, IZO, ITZO, Al, or other suitable conductive materials, but is not limited thereto.

The reflective structure RS may be disposed on a same layer as the emission diode ED. The reflective structure RS may be disposed on the first insulating layer IL1 and the second insulating layer IL2. The third insulating layer IL3 may partially overlap the reflective structure RS and may be disposed on the reflective structure RS between the first electrode AE and the second electrode CE. The third insulting layer IL3 may partially surround an outer surface of the reflective structure RS to protect the reflective structure RS. For example, the third insulating layer IL3 may surround the outer surface of the reflective structure RS. The first contact electrode CTE1 may electrically connect the reflective structure RS to the first electrode AE, and the second contact electrode CTE2 may contact the reflective structure RS and electrically contact the second electrode CE. The first contact electrode CTE1 may contact (e.g. directly contact) an end portion of the reflective structure RS, and the second contact electrode CTE2 may contact (e.g. directly contact) the another end portion of the emission diode ED.

Figure 7:
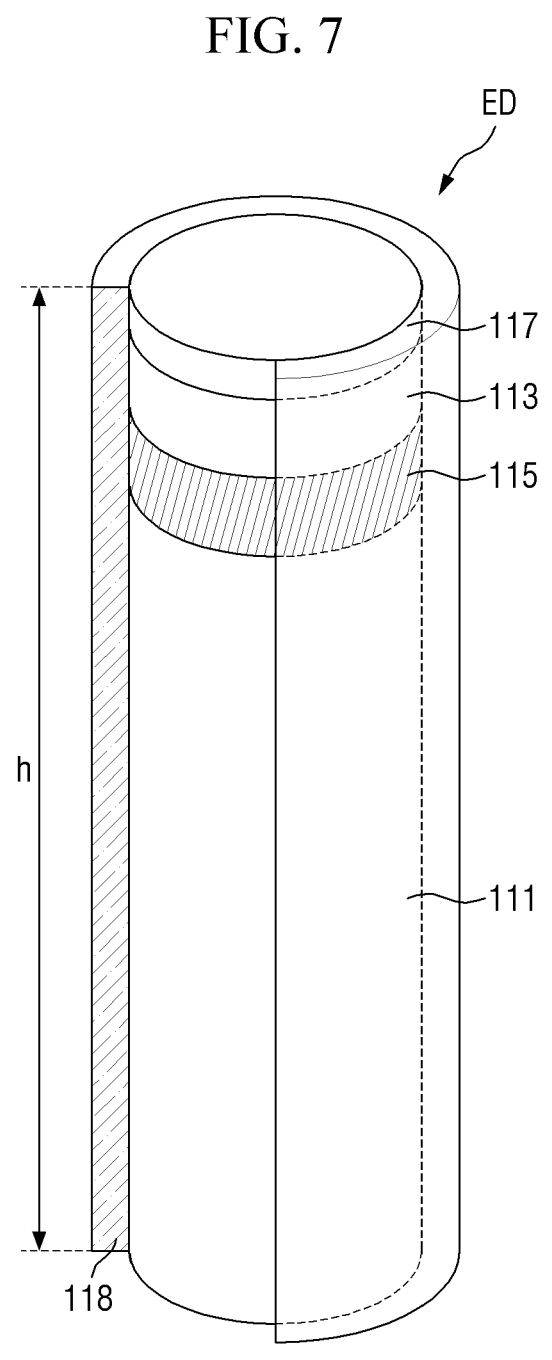

FIG. 7 is a schematic view illustrating a light emitting diode according to an embodiment of the disclosure.

Referring to FIG. 7, the emission diode ED may include a light emitting diode. For example, the emission diode ED may have a size of a micrometer scale (equal to or greater than 1 nm and less than 1 μm) or a nanometer scale (equal to or greater than 1 μm and less than 1 mm). For example, the emission diode ED may include an inorganic light emitting diode that includes an inorganic material. For example, the inorganic light emitting diode may be aligned between two electrodes opposing or facing each other in accordance with an electric field formed between the facing electrodes in a direction.

The emission diode ED may have an extended shape extended in a direction. The extended shape of the emission diode ED may have a rod shape, a wire shape, a tubular shape, or other suitable extended shapes. For example, the emission diode ED may be a cylindrical shape or a rod shape. In another example, the emission diode ED may have various shapes such as a polygonal pillar shape, such as a cube shape, a cuboid shape, a hexagonal pillar shape, or the like. The emission diode ED may have an extended shape having partially inclined portion. Semiconductors of the emission diode ED may be sequentially disposed or deposited (e.g. stacked) along the direction.

The emission diode ED may include a first semiconductor layer 111, a second semiconductor layer 113, an active layer 115, an electrode layer 117, and an insulating film 118.

The first semiconductor layer 111 may include an n type semiconductor. For example, in case that the emission diode ED emits blue light, the first semiconductor layer 111 may include a semiconductor material having a chemical formula of $Al_xGa_yIn_{1-x-y}N(0 \le x \le 1, 0 \le y \le 1, 0 \le x+y \le 1)$. The first semiconductor layer 111 may include at least one n type doped semiconductor material selected from the group of AlGaInN, GaN, AlGaN, InGaN, AlN and InN. The first semiconductor layer 111 may be doped with n type dopants such as Si, Ge or Sn. The first semiconductor layer 111 may be n-GaN doped with an n type Si. The first semiconductor layer 111 may have a length in a range of about 1.5 μm to about 5 μm, but is not limited thereto.

The second semiconductor layer 113 may be disposed on the active layer 115. For example, in case that the emission diode ED emits blue or green light, the second semiconductor layer 113 may include a semiconductor material having a chemical formula of $Al_xGa_yIn_{1-x-y}N(0 \le x \le 1, 0 \le y \le 1, 0 \le x+y \le 1)$. For example, the second semiconductor layer 113 may include at least one p type doped semiconductor material selected from the group of AlGaInN, GaN, AlGaN, InGaN, AlN and InN. The second semiconductor layer 113 may be doped with p type dopants such as Mg, Zn, Ca, Se or Ba. The second semiconductor layer 113 may be p-GaN doped with a p type Mg. The second semiconductor layer 113 may have a length in a range of about 0.05 μm to about 0.10 μm, but is not limited thereto.

Each of the first and second semiconductor layers 111 and 113 may be provided as a single layer structure, but is not limited thereto. For example, each of the first and second semiconductor layers 111 and 113 may have multiple layers including a clad layer or a tensile strain barrier reducing (TSBR) layer.

The active layer 115 may be disposed between the first and second semiconductor layers 111 and 113. The active layer 115 may include a material of a single or multiple quantum well structure. In case that the active layer 115 includes the material of the multiple quantum well structure, a quantum layer and a well layer may be alternately deposited (e.g. stacked) to form a multiple quantum well structure. In case that an electrical signal is applied to the active layer 115 through the first and second semiconductor layers 111 and 113, the active layer 115 may emit light by combination of electron-hole pairs. For example, in case that the active layer 115 emits blue light, the active layer 115 may include AlGaN, AlGaInN, or other suitable materials. In case that the active layer 115 has the multiple quantum well structure of the quantum layer and the well layer, which are alternately deposited, the quantum layer may include AlGaN, AlGaInN, or other suitable materials, and the well layer may include GaN, AlInN, or other suitable materials. The active layer 115 may include AlGaInN as the quantum layer and include AlInN as the well layer. Thus, the active layer 115 may emit the blue light.

In another example, the active layer 115 may have a deposited structure (e.g. stacked structure) of a semiconductor material having a big band gap energy and a semiconductor material having a small band gap energy. The semiconductor material having the big band gap energy and the semiconductor material having the small band gap energy may be alternately deposited to form the active layer 115. The active layer 115 may include group III or group V semiconductor materials in accordance with a wavelength range of emitting light. In another example, the active layer 115 may emit red or green light, but is not limited thereto. The active layer 115 may have a length in a range of about 0.05 μm to about 0.10 μm, but is not limited thereto.

The active layer 115 may emit the light in a longitudinal direction of the emission diode ED. The active layer 115 may also emit light through side surfaces of the emission diode ED. For example, the active layer 115 may emit the light in a circumferential direction of the emission diode ED. The direction of the light emitted from the active layer 115 may not be limited.

The electrode layer 117 may be (or include) an ohmic contact electrode. In another example, the electrode layer 117 may be (or include) a Schottky contact electrode. The emission diode ED may include at least one electrode layer 117. The electrode layer 117 may reduce resistance between the emission diode ED and an electrode or the contact electrode CTE in case that the emission diode ED is electrically connected to the electrode or the contact electrode CTE. The electrode layer 117 may include a metal having electrical conductivity. For example, the electrode layer 117 may include at least one of Al, Ti, In, Au, Ag, Indium Tin Oxide (ITO), Indium Zinc Oxide (IZO) and Indium Tin-Zinc Oxide (ITZO). The electrode layer 117 may include an n type or p type doped semiconductor material.

The insulating film 118 may surround outer surfaces of the first and second semiconductor layers 111 and 113, the active layer 115, and the electrode layer 117. The insulating film 118 may surround an outer surface of the active layer 115, and may be extended in the longitudinal direction of the emission diode ED to protect the emission diode ED. For example, the insulating film 118 may surround side surfaces of the emission diode ED, and may expose the end portions of the emission diode ED in the longitudinal direction thereof.

The insulating film 118 may include an insulating material such as silicon oxide ($SiO_x$), silicon nitride ($SiN_x$), silicon oxynitride ($SiO_xN_y$), Aluminum nitride (AlN), Aluminum oxide ($Al_2O_3$), or other suitable insulating materials. Therefore, the insulating film 118 may prevent electrical short, which may occur by direct contact between the active layer 115 and an electrode for transmitting an electrical signal to the emission diode ED. Also, the insulating film 118 may protect the outer surface of the emission diode ED including the active layer 115, thereby preventing deterioration of emission efficiency.

An outer surface of the insulating film 118 may be surface-treated. In manufacturing the display device 10 (e.g., refer to FIG. 2), a mixture of an ink and the emission diodes ED may be dropped on a space between the first and second electrodes AE and CE (refer to FIG. 5), and the emission diodes ED may be aligned between the first and second electrodes AE and CE by an electric field formed therebetween. In case that hydrophobic treatment or hydrophilic treatment is performed on the outer surface of the insulating film 118, the emission diodes ED may be uniformly scattered in the ink without being condensed with adjacent emission diodes ED.

Hereinafter, the reflective structure RS is provided below with reference to the drawings.

Figure 8:
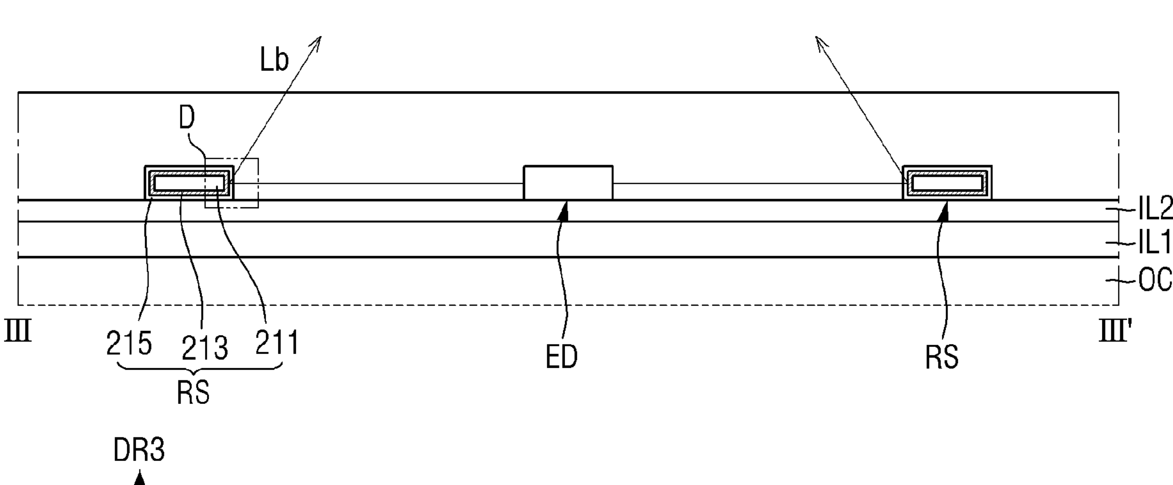
FIG. 8 is a schematic cross-sectional view taken along line III-III' of FIG. 4.
Figure 9:
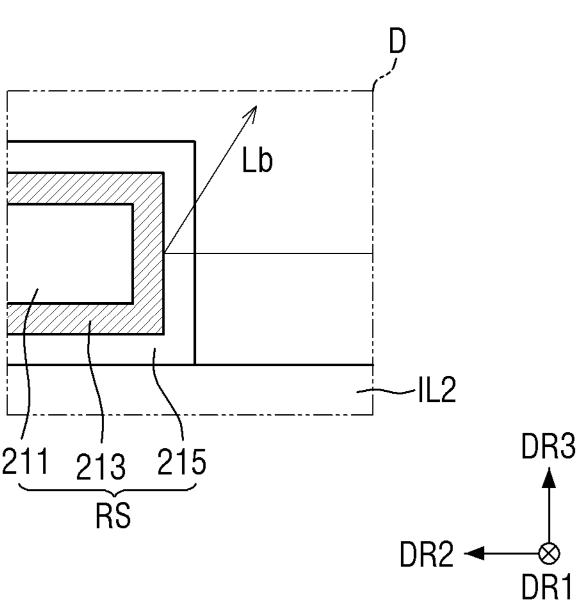
FIG. 9 is a schematic enlarged cross-sectional view illustrating area D of FIG. 8.
Figure 10:
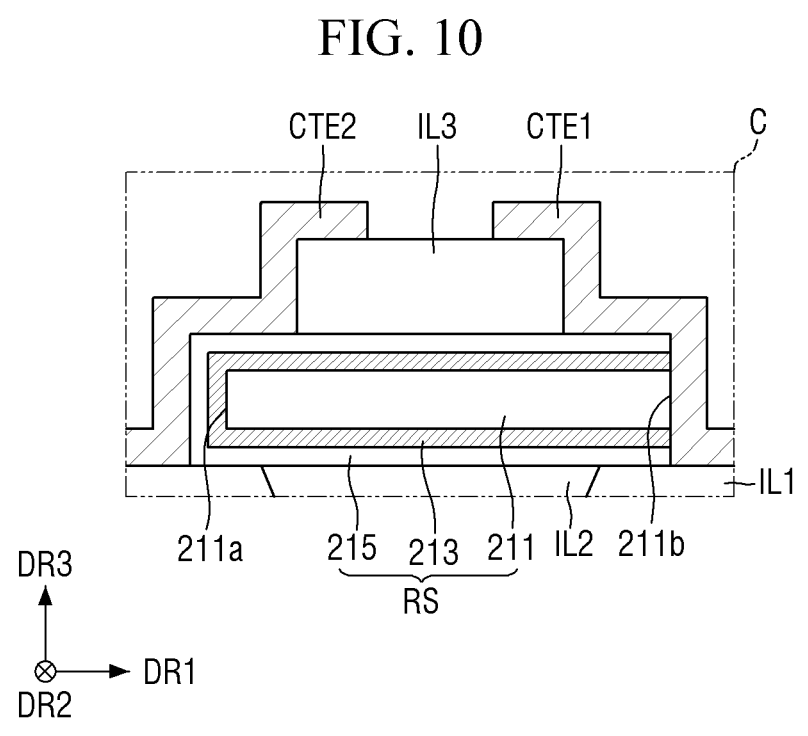
Figure 11:
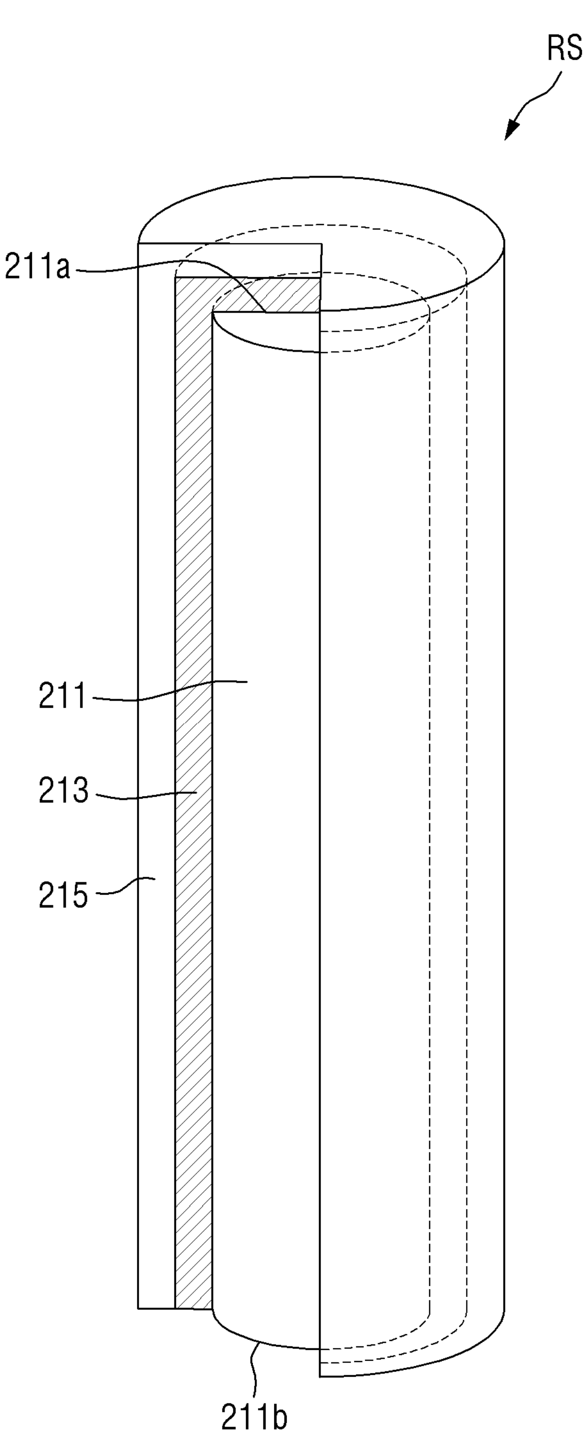
FIG. 11 is a schematic view illustrating a reflective structure according to an embodiment.

FIG. 8 is a schematic cross-sectional view taken along line III-III' of FIG. 4. FIG. 9 is a schematic enlarged cross-sectional view illustrating area D of FIG. 8. FIG. 10 is a schematic enlarged cross-sectional view illustrating area C of FIG. 5. FIG. 11 is a schematic view illustrating a reflective structure according to an embodiment.

Referring to FIG. 4 and FIGS. 8 to 11, the reflective structure RS may reflect light Lb emitted from the end portions of the long side of the emission diode ED toward the upper direction (e.g. third direction DR3). The reflective structure RS may include a reflective conductive pattern 213 to reflect the light Lb emitted from the end portions of the long side of the emission diode ED toward the upper direction. For example, the reflective structure RS may include a core layer 211 extended in the first direction DR1, a reflective conductive pattern 213 surrounding an outer surface of the core layer 211, and an insulating film 215 surrounding an outer surface of the reflective conductive pattern 213. The core layer 211 may have a rod shape, a wire shape, a tubular shape, or other suitable extended shapes.

The core layer 211 may include a semiconductor material. The semiconductor material may include at least one semiconductor material selected from the group of AlGaInN, GaN, AlGaN, InGaN, AlN, InN, and Si, but is not limited thereto.

The core layer 211 may include an end portion 211*a* positioned at a side thereof in the first direction DR1, and the another end portion 211*b* positioned at another side thereof in the first direction DR1.

The reflective conductive pattern 213 may surround the outer surface of the core layer 211. For example, the reflective conductive pattern 213 may cover (or overlap) any one of the end portions 211*a* and 211*b* of the core layer 211. For example, the reflective conductive pattern 213 may cover the end portion 211*a* of the core layer 211, and may expose the another end portion 211*b* of the core layer 211. The reflective conductive pattern 213 may directly contact the end portion 211*a* of the core layer 211.

The reflective conductive pattern 213 may include a reflective material. The reflective material may include Ag, Cu, Al or other suitable reflective material. The reflective conductive pattern 213 may reflect the light Lb emitted from the end portions of the long side of the emission diode ED.

The insulating film 215 may surround the outer surface of the reflective conductive pattern 213. Moreover, the insulating film 215 may cover any one of the end portions 211*a* and 211*b* of the core layer 211. For example, the insulating film 215 may cover the end portion 211*a* of the core layer 211, and may expose the another end portion 211*b* of the core layer 211. The insulating film 215 may contact (e.g. directly contact) the reflective conductive pattern 213 that covers the end portion 211*a* of the core layer 211.

The insulating film 215 may include an insulating material. For example, the insulating film 215 may include silicon oxide ($SiO_x$), silicon nitride ($SiN_x$), silicon oxynitride ($SiO_xN_y$), Aluminum nitride (AlN), Aluminum oxide ($Al_2O_3$), or other suitable insulating material.

The contact electrodes CTE1 and CTE2 may contact (e.g. directly contact) another end portion 211*b* of the core layer 211, another end portion of the reflective conductive pattern 213 in the first direction DR1, both end portions of the insulating film 215 in the first direction DR1, and the upper surface of the insulating film 215 exposed by the third insulating layer IL3. For example, the insulating film 215 may cover only one end portion 211*a* of the core layer 211, and the contact electrodes CTE1 and CTE2 may contact (e.g. directly contact) only the another end portion 211*b* of the core layer 211. The lower portion of the insulating film 215 may surround the longitudinal surface of the core layer 211. The lower portion of the insulating film 215 may contact (directly contact) the first and second insulating layers IL1 and IL2.

Figure 12:
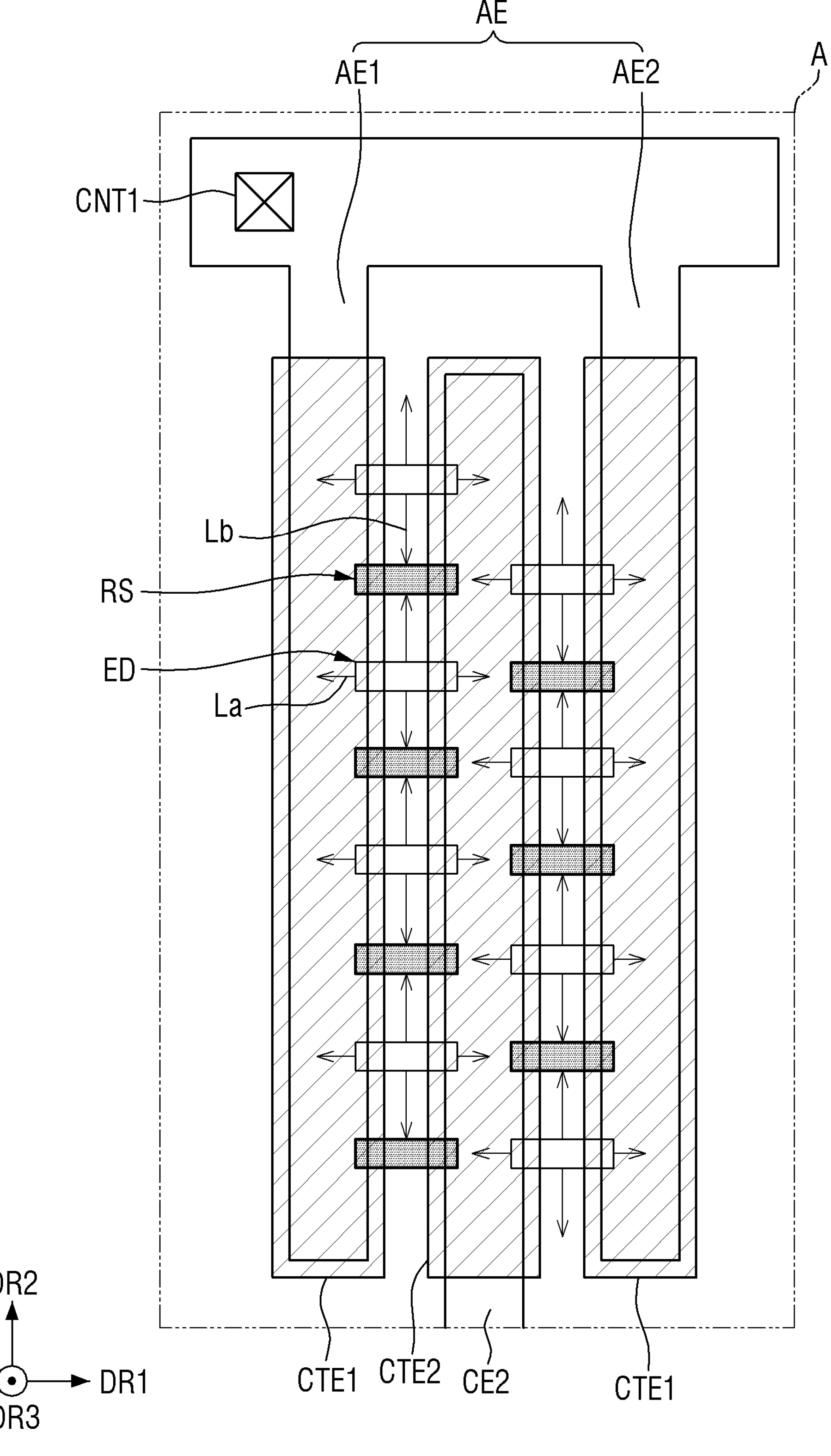
FIG. 12 is a schematic enlarged plan view illustrating area A of FIG. 4.

FIG. 12 is a schematic enlarged plan view illustrating area A of FIG. 4.

Referring to FIG. 12, the reflective structure RS may be spaced apart from the emission diode ED. The emission diode ED and the reflective structure RS may be spaced apart from each other along the second direction DR2. Multiple reflective structures RS may be provided in each of subpixels SPX1, SPX2, and SPX3 (refer to FIG. 4). The emission diodes ED and the reflective structures RS may be alternately disposed along the second direction DR2. The emission diode ED may be disposed between adjacent ones of the reflective structures RS.

The light La may be emitted from the end portions of the short side of the emission diode ED. The light La emitted from the end portions of the short side of the emission diode ED may be reflected from the first and second electrodes AE and CE toward the upper direction (e.g. third direction DR3), and the reflective structure RS may reflect the light Lb emitted from the end portions of the long side of the emission diode ED toward the upper direction (e.g. third direction DR3). Thus, the lights emitted from the emission diode ED in various directions including the first and second directions DR1 and DR2 may be guided toward the upper direction (e.g. third direction DR3) by the reflective structure RS and the first and second electrodes AE and CE. Thus, luminance in the upper direction of the display device 10 (refer to FIG. 2) may be improved.

Hereinafter, a process of manufacturing the aforementioned reflective structure RS is provided below with reference to the drawings.

FIGS. 13 to 16 are schematic cross-sectional views per process step illustrating a process of manufacturing a reflective structure according to an embodiment.

Figure 13:
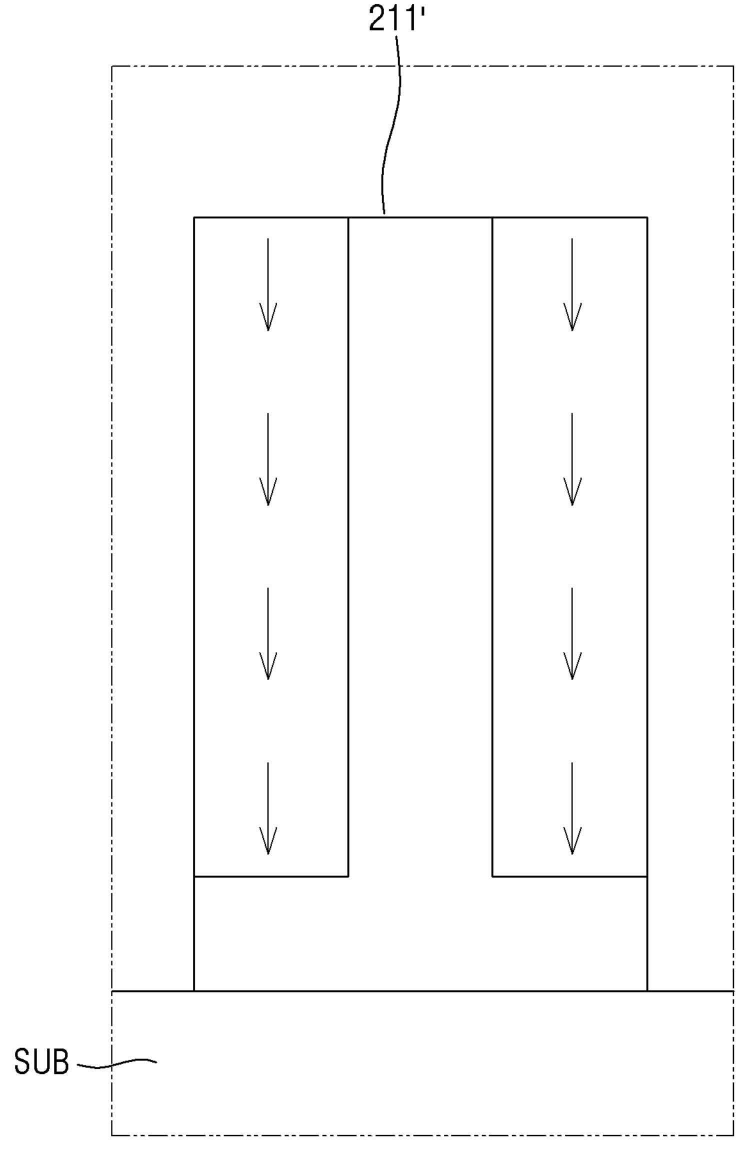
FIGS. 13 to 16 are schematic cross-sectional views per process step illustrating a process of manufacturing a reflective structure according to an embodiment.

Referring to FIG. 13, a core layer 211' may be grown on a base portion SUB. The core layer 211' may be grown in a thickness direction. The core layer 211' may include a semiconductor material. The semiconductor material of the core layer 211' may include AlGaInN, GaN, AlGaN, InGaN, AlN, InN, Si or other suitable semiconductor materials, but is not limited thereto.

Figure 14:
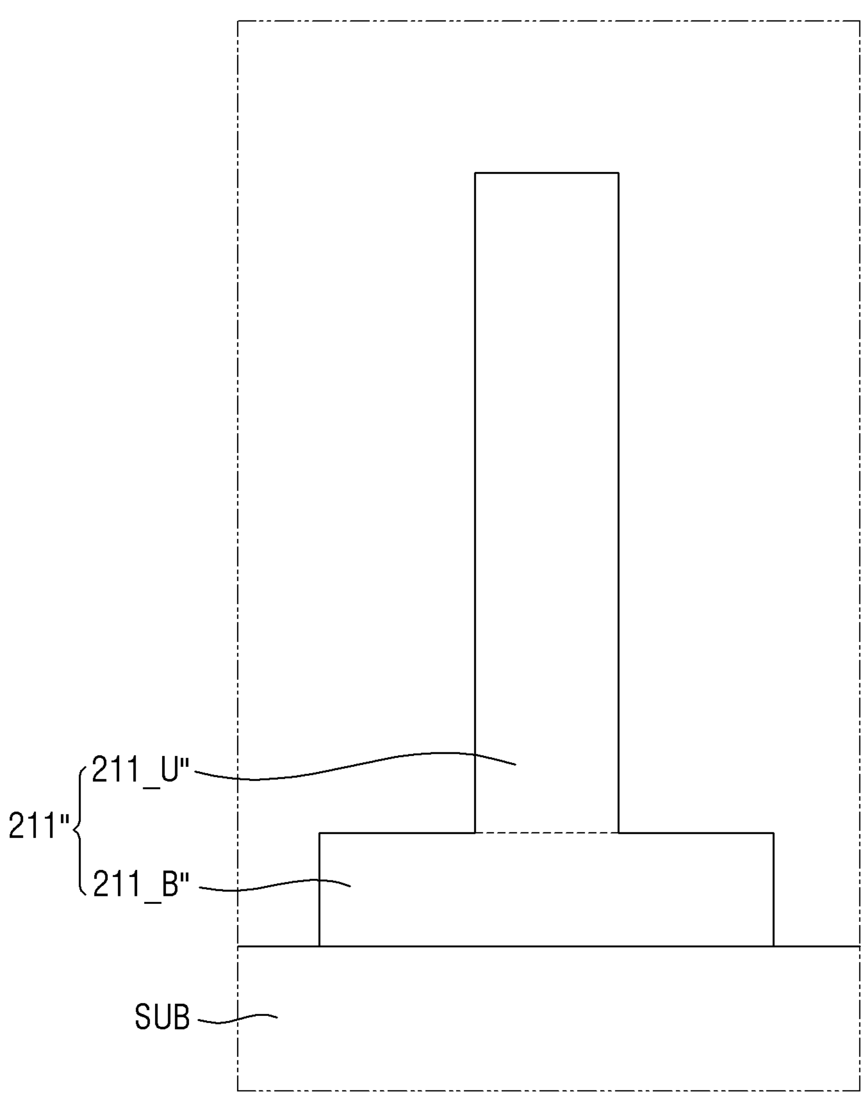

Referring to FIG. 14, the core layer 211' (refer to FIG. 13) may be partially etched, and a bottom portion 211_B" and a protrusion portion 211_U" may remain on the base portion SUB. The protrusion portion 211_U" may protrude (or extend) from the bottom portion 211_B" in the thickness direction. The core layer 211' (refer to FIG. 13) may be etched through wet etching or dry etching. Thus, a core layer 211" including the bottom portion 211_B" and the protrusion portion 211_U" may be formed on the base portion SUB.

Figure 15:
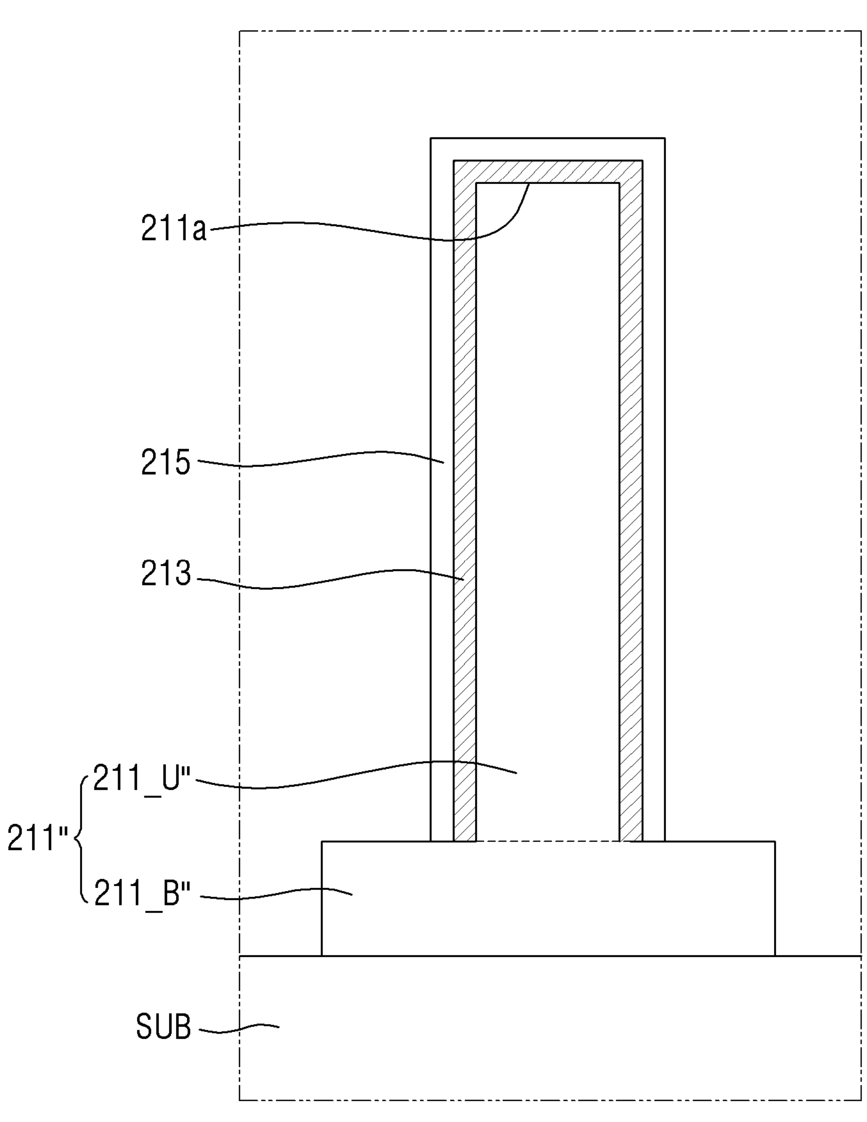

Referring to FIG. 15, a reflective conductive pattern 213 may be formed on an outer surface of the protrusion portion 211_U" of the core layer 211" to surround the outer surface of the protrusion portion 211_U" of the core layer 211". The reflective conductive pattern 213 may cover a longitudinal surface of the protrusion portion 211_U" (or side portion) extended in the thickness direction thereof and an end portion 211*a* of the protrusion portion 211_U".

The reflective conductive pattern 213 may include a reflective material. The reflective material may include Ag, Cu, Al or an alloy thereof.

An insulating film 215 may be formed on the outer surface of the reflective conductive pattern 213, and may surround the outer surface of the reflective conductive pattern 213. The insulating film 215 may cover the reflective conductive pattern 213, which covers the longitudinal surface (or side surface) extended in the thickness direction of the protrusion portion 211_U" and the end portion 211*a* of the protrusion portion 211_U". For example, the insulating film 215 may cover a longitudinal surface (or side surface) and an end portion (or an upper end portion) of the reflective conductive pattern 213.

As shown in FIG. 15, a lower end portion of the reflective conductive pattern 213, a lower end portion of the insulating film 215, and a lower end portion of the core layer 211 in the thickness direction may contact (e.g. directly contact) the bottom portion 211_B". For example, the lower end portion of the reflective conductive pattern 213 of FIGS. 15 and 16 may correspond to another end portion of the reflective conductive pattern 213 of FIG. 10. The lower end portion of the insulating film 215 of FIGS. 15 and 16 may correspond to another end portion of the insulating film 215 of FIG. 10. The lower end portion of the core layer 211 of FIGS. 15 and 16 may correspond to another end portion 211*b* of the core layer 211 of FIG. 10.

Figure 16:
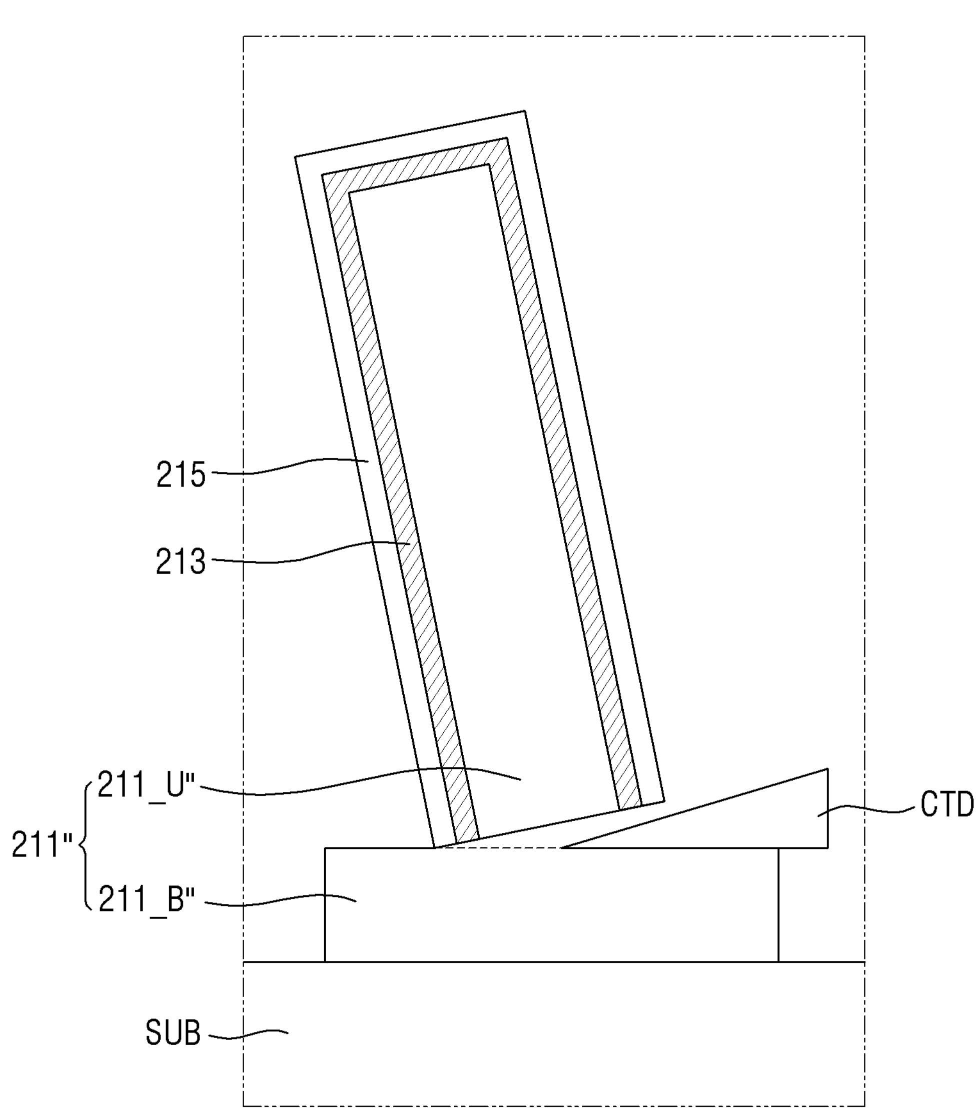

Referring to FIG. 16, the lower end portion of the reflective conductive pattern 213, the lower end portion of the insulating film 215, and the another end portion (e.g. the lower end portion) of the core layer 211 may be cut (or separated) from the bottom portion 211_B". The cutting (or separation) of the lower end portion of the reflective conductive pattern 213, the lower end portion of the insulating film 215, and the lower end portion of the core layer 211 from the bottom portion 211_B" may be performed by a cutting device CTD. The protrusion portion 211_U" may correspond to the core layer 211 of FIG. 11.

Hereinafter, another embodiments of various reflective structures are provided below with reference to the drawings.

Figure 17:
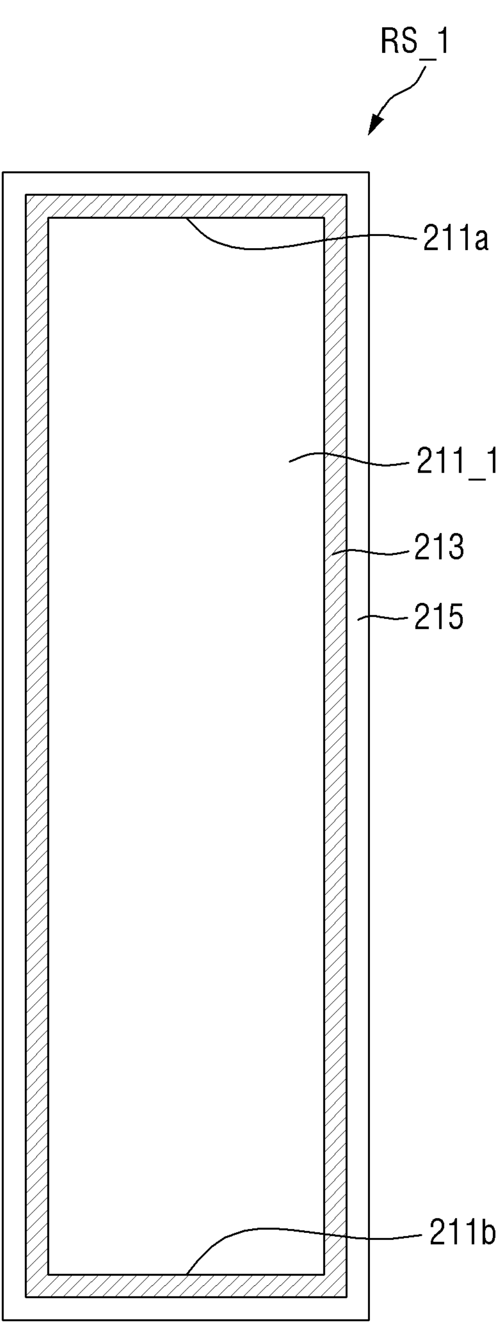
FIG. 17 is a schematic cross-sectional view illustrating a reflective structure according to an embodiment.

FIG. 17 is a schematic cross-sectional view illustrating a reflective structure according to an embodiment.

Referring to FIG. 17, a reflective structure RS_1 according to the embodiment is different from the reflective structure RS of FIG. 11 in that the reflective conductive pattern 213 covers another end portion 211*b* of a core layer 211_1. Thus, detailed description of the same constituent elements is omitted.

The reflective structure RS_1 according to the embodiment may cover the another end portion 211*b* of the core layer 211_1. The reflective conductive pattern 213 may contact (e.g. directly contact) the another end portion 211*b* of the core layer 211_1. The insulating film 215 may cover the another end portion 211*b* of the core layer 211_1. The insulating film 215 may contact (e.g. directly contact) the reflective conductive pattern 213 that contacts (e.g. directly contacts) the another end portion 211*b* of the core layer 211_1.

The core layer 211_1 according to the embodiment may have a shape similar to that of the core layer 211 of FIG. 11. For example, the core layer 211_1 may have a rod shape, a wire shape, a tubular shape, or other suitable extended shapes. The core layer 211_1 may have a rectangular cross-section, but is not limited thereto.

The core layer 211_1 according to the embodiment may include a different material from that of the core layer 211 of FIG. 11. The core layer 211_1 according to the embodiment may include a glass material. For example, the core layer 211_1 may include a glass bead, but is not limited thereto.

Figure 18:
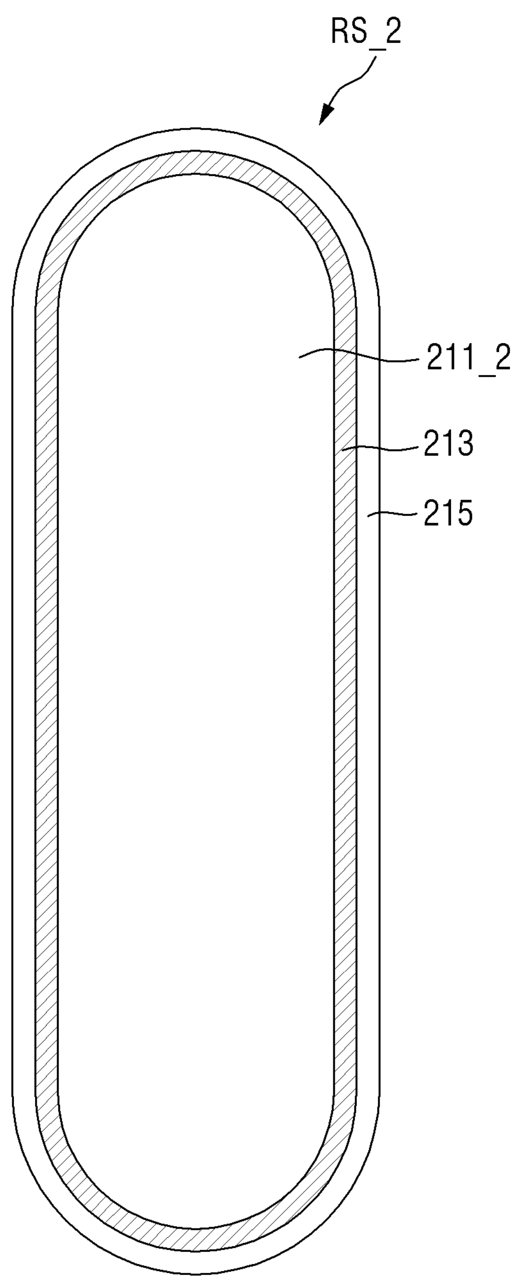
FIG. 18 is a schematic cross-sectional view illustrating a reflective structure according to an embodiment.

FIG. 18 is a schematic cross-sectional view illustrating a reflective structure according to an embodiment.

Referring to FIG. 18, a core layer 211_2 of a reflective structure RS 2 according to the embodiment has a different shape from that of the core layer 211_1 of the reflective structure RS_1 according to FIG. 17. The core layer 211_2 according to the embodiment may have an elliptical cross-section. The reflective structure RS_2 according to the embodiment may have an advantage in that the core layer 211_2 has a shape suitable for mass production, as compared with the reflective structure RS_1 according to FIG. 17.

While the invention has been illustrated and described with reference to the embodiments thereof, it will be apparent to those of ordinary skill in the art that various changes in form and detail may be formed thereto without departing from the spirit and scope of the invention.

What is claimed is:

1. A display device comprising:
first banks disposed on a substrate and spaced apart from each other in a first direction;
a first electrode and a second electrode disposed on the first banks;
a light emitting diode disposed between the first electrode and the second electrode; and
at least one reflective structure disposed between the first electrode and the second electrode and spaced apart from the light emitting diode, wherein the reflective structure does not emit light,
wherein
the light emitting diode and the at least one reflective structure are spaced apart from each other in a second direction intersecting the first direction; and
the reflective structure comprises an undoped core layer and a reflective conductive pattern directly contacting and entirely covering an outer surface of the undoped core layer and entirely covering at least an end portion of the undoped core layer.

2. The display device of claim 1, wherein
an end portion of the light emitting diode is electrically connected to the first electrode, and
another end portion of the light emitting diode is electrically connected to the second electrode.

3. The display device of claim 2, further comprising:
a first insulating layer disposed on the first electrode and the second electrode,
wherein the first insulating layer overlaps a portion of the first electrode and a portion of the second electrode.

4. The display device of claim 3, further comprising:
a first contact electrode and a second contact electrode disposed on the first insulating layer, wherein
the first contact electrode electrically connects the light emitting diode to the first electrode, and
the second contact electrode electrically connects the light emitting diode to the second electrode.

5. The display device of claim 4, wherein
the first contact electrode electrically contacts the end portion of the light emitting diode, and
the second contact electrode electrically contacts the another end portion of the light emitting diode.

6. The display device of claim 5, wherein the light emitting diode has a shape extended in the first direction and emits light.

7. The display device of claim 6, wherein each of the first electrode and the second electrode includes a reflective conductive material.

8. The display device of claim 7, wherein the reflective conductive material includes Ag, Cu or Al.

9. The display device of claim 7, wherein each of the first electrode and the second electrode reflects the light emitted from the light emitting diode toward an upper direction of the display device.

10. The display device of claim 6, wherein
an end portion of the at least one reflective structure contacts the first electrode, and
another end portion of the at least one reflective structure contacts the second electrode.

11. The display device of claim 10, wherein
the first contact electrode electrically connects the at least one reflective structure to the first electrode, and
the second contact electrode contacts the at least one reflective structure and electrically contacts the second electrode.

12. The display device of claim 11, wherein
the first contact electrode contacts an end portion of the at least one reflective structure, and
the second contact electrode contacts the another end portion of the at least one reflective structure.

13. The display device of claim 12, wherein the at least one reflective structure has a shape extended in the first direction.

14. The display device of claim 13, wherein
the at least one reflective structure includes a plurality of reflective structures,
the plurality of reflective structures are spaced apart from each other, and
the light emitting diode is disposed between the reflective structures.

15. The display device of claim 13, wherein the at least one reflective structure reflects the light emitted from the light emitting diode toward an upper direction of the display device.

16. A display device comprising:
first banks disposed on a substrate and spaced apart from each other in a direction;
a first electrode and a second electrode disposed on the first banks; and
at least one reflective structure disposed between the first electrode and the second electrode,
wherein the at least one reflective structure does not emit light, has a shape extended in the direction, and includes:
an undoped core layer comprising an outer surface and an end portion;

a reflective conductive pattern directly contacting and entirely surrounding the outer surface and the end portion of the undoped core layer; and an insulating film surrounding an outer surface of the reflective conductive pattern.

17. The display device of claim 16, wherein the reflective conductive pattern includes Ag, Cu, or Al, and the undoped core layer includes AlGalnN, GaN, AlGaN, InGaN, AlN, InN, or Si.

18. The display device of claim 16, wherein the undoped core layer further includes:

another end portion positioned at another side in the direction, and the reflective conductive pattern overlaps the end portion and the another end portion of the undoped core layer.

19. The display device of claim 18, wherein the undoped core layer includes a glass material.

20. The display device of claim 1, wherein the at least one reflective structure reflects light emitted by the light emitting diode in the second direction toward a third direction intersecting the first direction and the second direction.

21. The display device of claim 1, wherein the at least one reflective structure comprises an insulating film directly contacting and entirely covering an outer surface of the reflective conductive pattern along an entire length of the undoped core layer and directly contacting and entirely covering a first end of the reflective conductive pattern.

22. A display device comprising:

first banks disposed on a substrate and spaced apart from each other in a first direction;

a first electrode and a second electrode disposed on the first banks;

a light emitting diode disposed between the first electrode and the second electrode; and at least one reflective structure disposed between the first electrode and the second electrode and spaced apart from the light emitting diode, wherein the reflective structure does not emit light, wherein the light emitting diode and the at least one reflective structure are spaced apart from each other in a second direction intersecting the first direction; and the at least one reflective structure comprises a core layer formed without intentional dopants and a reflective conductive pattern directly contacting and entirely surrounding an outer surface of the core layer and entirely covering at least a first end portion of the core layer; and an insulating film directly contacting and entirely surrounding an outer surface of the reflective conductive pattern along an entire length of the core layer and entirely covering a first end of the reflective conductive pattern.

23. The display device of claim 22, wherein the core layer consists of one or more materials selected from the group consisting of AlGalnN, GaN, AlGaN, InGaN, AlN, InN, and Si.

* * * * *